United States Patent
Kuroda

(10) Patent No.: US 7,956,136 B2
(45) Date of Patent: Jun. 7, 2011

(54) RESIN COMPOSITION FOR SEMICONDUCTOR ENCAPSULATION AND SEMICONDUCTOR DEVICE

(75) Inventor: Hirofumi Kuroda, Tochigi (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 984 days.

(21) Appl. No.: 11/632,434

(22) PCT Filed: Jul. 19, 2005

(86) PCT No.: PCT/JP2005/013256
§ 371 (c)(1),
(2), (4) Date: Jan. 12, 2007

(87) PCT Pub. No.: WO2006/009147
PCT Pub. Date: Jan. 26, 2006

(65) Prior Publication Data
US 2008/0097010 A1    Apr. 24, 2008

(30) Foreign Application Priority Data

| | | |
|---|---|---|
| Jul. 22, 2004 | (JP) | 2004-214389 |
| Aug. 25, 2004 | (JP) | 2004-245088 |
| Aug. 25, 2004 | (JP) | 2004-245089 |
| Jan. 7, 2005 | (JP) | 2005-003234 |
| Mar. 29, 2005 | (JP) | 2005-096568 |

(51) Int. Cl.
*C08F 283/10* (2006.01)
*C08L 63/00* (2006.01)
*B32B 27/38* (2006.01)

(52) U.S. Cl. .................. 525/524; 525/523; 428/413

(58) Field of Classification Search .................. 428/413; 525/523, 524
See application file for complete search history.

(56) References Cited

U.S. PATENT DOCUMENTS 7,307,128 B2 * 12/2007 Hayakawa et al. ........... 525/481
2005/0069715 A1    3/2005 Hayakawa

FOREIGN PATENT DOCUMENTS

| CN | 1636987 | 7/2005 |
|---|---|---|
| JP | 07-130919 | 5/1995 |
| JP | 08-020673 | 1/1996 |
| JP | 11-001541 | 1/1999 |
| JP | 11-140277 | 5/1999 |
| JP | 11-147940 | 6/1999 |
| JP | 2001-233936 | 8/2001 |
| JP | 2003-089718 | 3/2003 |
| JP | 2003-292574 | 10/2003 |
| JP | 2005-113084 | 4/2005 |

* cited by examiner

*Primary Examiner* — Mark Eashoo
*Assistant Examiner* — Megan McCulley
(74) *Attorney, Agent, or Firm* — Smith, Gambrell & Russell, LLP

(57) ABSTRACT

The object of the invention is to provide a resin composition for semiconductor encapsulation realizing excellent soldering resistance and flame resistance and having excellent flowability and curing properties, and a semiconductor device. The invention has solved the object by a resin composition for semiconductor encapsulation comprising (A) an epoxy resin containing (a) an epoxy resin represented by formula (1), (B) a compound having two or more phenolic hydroxyl groups in its molecule, (C) an inorganic filler, and (D) a curing accelerator:

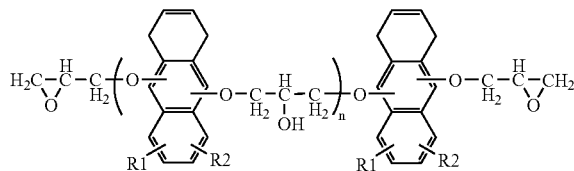

wherein each of R1 and R2 represents a hydrogen atom or a hydrocarbon group with 4 or less carbon atoms and may be the same or different; and 'n' represents a mean value that is a positive number of from 0 to 5; in the formula (1).

15 Claims, 2 Drawing Sheets

RESIN COMPOSITION FOR SEMICONDUCTOR ENCAPSULATION AND SEMICONDUCTOR DEVICE

BACKGROUND OF THE INVENTION

1. Field of the Invention

The present invention relates to a resin composition for semiconductor encapsulation and a semiconductor device using the same.

2. Description of the Related Art

In the recent trend of down-sizing, lighter weight and high performance of electronic devices on the market, high integration of a semiconductor element (also referred to hereinafter as chip) is advancing year by year, and as surface mounting of a semiconductor device (also referred to hereinafter as package) is promoted, the requirements for an epoxy resin composition for semiconductor encapsulation (also referred to hereinafter as encapsulating material or encapsulating compound) become increasingly strict. As semiconductor devices are down-sized and thinned, further high flowability and high strength are required of the epoxy resin composition for semiconductor encapsulation. Especially under the present circumstance where the surface mounting of a semiconductor device comes to be general, a semiconductor device having absorbed moisture is exposed to high temperatures at the time of soldering, upon which the explosive stress of gasified water vapor causes cracking in the semiconductor device, or generates delamination between a semiconductor element or a lead frame and a cured product of the epoxy resin composition, resulting in significant deterioration in electrical reliability. For a tendency toward abolition of use of lead, lead-free solder having a higher melting point than conventional is increasingly frequently used. Because use of the lead-free solder needs the mounting temperature to be higher by about 20° C. than conventional, there arises a problem of more significant deterioration after mounting in the reliability of the semiconductor device than before. Accordingly, prevention of the deterioration in reliability described above, that is, improvement of soldering resistance is a great issue. From the viewpoint of an environmental problem, there is also an increasing need for flame retardancy without using a flame retardant such as a Br compound or antimony oxide. For improving soldering resistance and flame resistance, higher loading of inorganic fillers is regarded effective because water absorption can be reduced for soldering resistance and the content of easily flammable resin can be reduced for flame resistance. Under these circumstances, there is a recent trend for the epoxy resin composition to use a resin of lower viscosity and to load a larger amount of inorganic fillers.

For maintaining high flowability and low viscosity during molding, use of a resin of low melt viscosity is known (see, for example, Japanese Patent Application Laid-Open (JP-A) No. 7-130919 (pages 2 to 10)). For increasing the amount of inorganic fillers loaded, surface treatment of the inorganic fillers with a silane coupling agent is known (see, for example, JP-A No. 8-20673 (pages 2 to 6)). With only these methods given, however, high flowability, soldering resistance and flame retardancy during molding cannot be simultaneously satisfied.

Accordingly, the present applicant have proposed an epoxy resin composition excellent in soldering resistance and flame resistance by using a phenol aralkyl type epoxy resin containing biphenylene structure and a phenol aralkyl type phenol resin containing biphenylene structure (see, for example, JP-A No. 11-140277 (pages 2 to 11)).

However, further improvements in soldering resistance and flame resistance are desired for the recent higher need described above.

In the meanwhile, in the recent trend of down-sizing, lighter weight and high performance of electronic devices on the market, high integration of a semiconductor is advancing year by year, and as surface mounting of a semiconductor package is promoted, an area surface-mounted package is newly developed and is being substituted for a package of conventional structure.

A ball grid array (referred to hereinafter as BGA), or a chip size package (referred to hereinafter as CSP) further pursuing down-sizing, is representative of the area surface-mounted semiconductor package, and these were developed for coping with the requirements for multi-pin and high speed which are in nearly maximum degrees in the conventional surface-mounted package represented by QFP and SOP. In its structure, a semiconductor element is mounted on one side of a rigid circuit substrate represented by bismaleimide/triazine (referred to hereinafter as BT) resin/copper foil circuit substrate, or a flexible circuit substrate represented by polyimide resin film/copper foil circuit substrate, and its element-mounted surface, that is, only one side of the substrate is molded and encapsulated with a resin composition or the like. Solder balls are arranged two-dimensionally in parallel and formed on the side opposite to the element-mounted surface of the substrate, so as to join to the package-mounted circuit substrate. As the element-mounted substrate, a structure using a metallic substrate such as a lead frame other than the organic circuit substrate is also devised.

The structure of the area surface-mounted semiconductor package has a structure encapsulated in one side wherein the substrate is encapsulated with a resin composition in the element-mounted side but not in the solder ball-formed side. In a very few cases, an encapsulating resin layer of about several tens μm is present in the solder ball-formed side of a metal substrate such as a lead frame, while an encapsulating resin layer of about several hundreds μm to several mm is formed on the element-mounted side, and thus the substrate is encapsulated in substantially one side. It follows that due to the imbalance in thermal expansion and thermal shrinkage between the organic or metallic substrate and a cured product of the resin composition or due to the influence of curing shrinkage during molding and curing of the resin composition, these packages are liable to cause warpage just after molding. When the circuit substrate on which these package was mounted is soldered, it is subjected to a step of heating to 200° C. or more, at which the warpage of the package is generated, and a large number of solder balls do not become flat and are raised from the package-mounted circuit substrate, thus also causing a problem of deterioration in electrical connection reliability.

To reduce the warpage of the package wherein only one side of the substrate was substantially encapsulated with the resin composition, a method of reducing the curing shrinkage of the resin composition is known. The organic substrate frequently uses a resin of high glass transition temperature (referred to hereinafter as Tg) such as BT resin and polyimide resin, and these resins have higher Tg than about 170° C. that is the molding temperature of the resin composition. In a cooling process of from molding temperature to room temperature in this case, the organic substrate is shrunk when the linear expansion coefficient of the substrate is in only the region of $\alpha 1$. Accordingly, if the resin composition also has high Tg, its $\alpha 1$ is the same as that of the circuit substrate, and the curing shrinkage is zero, then the warpage is considered to become nearly zero. Accordingly, a method of reducing the curing shrinkage of a resin composition by increasing Tg by combining a triphenol methane type epoxy resin with a triphenol methane type phenol resin has already been proposed (see, for example, JP-A No. 11-147940 (pages 2 to 7)).

For reducing warpage, there is known a method wherein the linear expansion coefficient of a substrate and the linear expansion coefficient of a cured product of a resin composition are made nearly equal to each other. As described above, a method wherein a resin of low melt viscosity is used to increase the content of inorganic fillers thereby adjusting α1 to that of a substrate has already been proposed (see, for example, JP-A No. 11-1541 (pages 2 to 5)). Further, use of a resin containing a naphthalene ring structure estimated to be capable of reducing linear expansion coefficient has also been proposed (see, for example, JP-A No. 2001-233936 (pages 2 to 8)). Such resin composition hardly causes warpage, but due to high water absorption of its cured product, cracking easily occurs during soldering. Further, the resin composition is poor in flame resistance for practical use unless a flame retardant is used. From the foregoing, there has been demand for techniques capable of satisfying low warpage, soldering resistance and flame resistance without deteriorating flowability and curing properties, even in the area surface-mounted semiconductor package.

As described above, there has been a desire for the development of an encapsulating material wherein high levels of soldering resistance, flame resistance and flowability required of both a peripheral surface-mounted semiconductor package with lead frame and a one side encapsulated area surface-mounted semiconductor package are satisfied and simultaneously sufficient low warpage is achieved.

SUMMARY OF THE INVENTION

The present invention was made to solve the problem described above, and the main object of the present invention is to provide a resin composition for semiconductor encapsulation realizing excellent soldering resistance and flame resistance and having excellent flowability and curing properties, and a semiconductor device using the same.

The resin composition for semiconductor encapsulation according to the present invention comprises (A) an epoxy resin containing (a) an epoxy resin represented by formula (1), (B) a compound having two or more phenolic hydroxyl groups in its molecule, (C) an inorganic filler, and (D) a curing accelerator:

to 0 (zero) at 80% or more of the total amount of the epoxy resin (a), in order that the resin composition can prevent an increase in the viscosity thereof, may realize excellent soldering resistance and flame resistance and may readily have excellent flowability and curing properties.

In the resin composition for semiconductor encapsulation according to the present invention, it is preferable that the epoxy resin (a) represented by the formula (1) has a hydrolyzable chlorine content of 300 ppm or less, in order that the resin composition can prevent generation of failure in the moisture resistance reliability of the resin composition and may readily have particularly excellent soldering resistance.

In the resin composition for semiconductor encapsulation according to the present invention, it is preferable that the compound (B) having two or more phenolic hydroxyl groups in its molecule comprises a compound represented by formula (2) in order that the resin composition can realize particularly excellent soldering resistance and flame resistance and may have excellent flowability and curing properties:

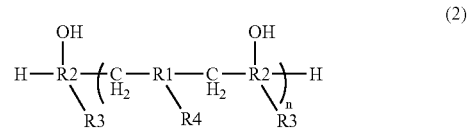

wherein R1 represents a phenylene group, a biphenylene group, a naphthylene group or a hydroxy phenylene group; R2OH represents a phenol, α-naphthol, or β-naphthol; each of R3 and R4 is a group bonded to each of R2 and R1 and represents a hydrogen atom or a hydrocarbon group with 10 or less carbon atoms, and may be the same or different; and 'n' represents a mean value that is a positive number of from 1 to 10; in the formula (2).

In the resin composition for semiconductor encapsulation according to the present invention, it is preferable that the compound (B) having two or more phenolic hydroxyl groups in its molecule comprises a compound represented by formula (3) in order that the resin composition particularly realizes excellent soldering resistance and flame resistance and may have excellent flowability and curing properties:

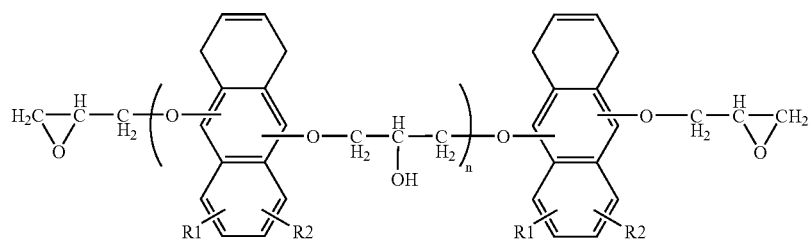

wherein each of R1 and R2 represents a hydrogen atom or a hydrocarbon group with 4 or less carbon atoms and may be the same or different; and 'n' represents a mean value that is a positive number of from 0 to 5; in the formula (1).

In the resin composition for semiconductor encapsulation according to the present invention, it is preferable that the epoxy resin (a) represented by the formula (1) contains a component having a structure of the formula (1) with n equal

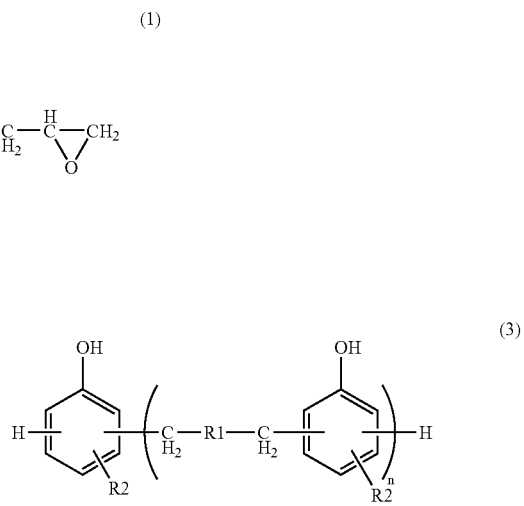

wherein R1 represents a phenylene group or a biphenylene group; R2 represents a hydrogen atom or a hydrocarbon group with 4 or less carbon atoms and may be the same or different; and 'n' represents a mean value that is a positive number of from 1 to 5; in the formula (3).

In the resin composition for semiconductor encapsulation according to the present invention, it is preferable that the compound (B) having two or more phenolic hydroxyl groups in its molecule comprises a compound represented by formula (4). Particularly in this case, the resin composition can realize low warpage in an area surface-mounted semiconductor package, excellent soldering resistance and flame resistance and may have excellent flowability and curing properties:

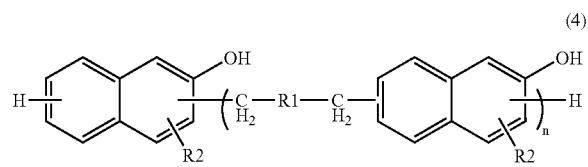

(4)

wherein R1 represents a phenylene group or a biphenylene group; R2 represents a hydrogen atom or a hydrocarbon group with 4 or less carbon atoms and may be the same or different; and 'n' represents a mean value that is a positive number of from 1 to 10; in the formula (4).

In the resin composition for semiconductor encapsulation according to the present invention, it is preferable that the compound having two or more phenolic hydroxyl groups in its molecule (B) comprises a compound represented by formula (5). Particularly in this case, the resin composition can realize low warpage in an area surface-mounted semiconductor package:

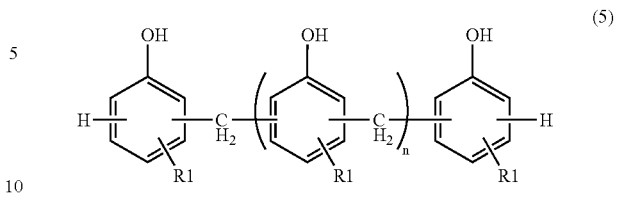

(5)

wherein R1 represents a hydrogen atom or a hydrocarbon group with 4 or less carbon atoms and may be the same or different; and 'n' represents a mean value that is a positive number of from 0 to 8; in the formula (5).

The compound represented by formula (5) is preferably a compound having weight average molecular weight within a range of 400 to 600, polydispersity ratio ((Mw)/(Mn)) of weight average molecular weight (Mw) to number average molecular weight (Mn) within a range of 1.4 or less, and softening point within a range of 60 to 70° C., in order that the resin composition may exhibit less reduction in curing properties regardless of low viscosity and can realize both flowability and curing properties. In this case, the resin composition can realize further improvement in flowability while maintaining low warpage and curing properties particularly in an area surface-mounted semiconductor package.

Preferably, the resin composition for semiconductor encapsulation according to the present invention further comprises (a') a crystalline epoxy resin which is at least one member selected from the group consisting of (a'-1) an epoxy resin represented by formula (6) and (a'-2) an epoxy resin represented by formula (7). Particularly in this case, the resin composition can have lower viscosity and higher flowability, thereby obtaining excellent flowability even with high loading of the inorganic filler. In the case of the high loading of the inorganic filler, soldering resistance and flame resistance can be improved:

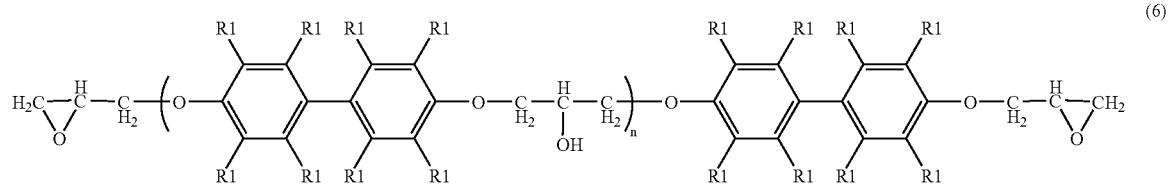

(6)

wherein R1 represents a hydrogen atom or a hydrocarbon group with 4 or less carbon atoms and may be the same or different; and 'n' represents a mean value that is a positive number of from 0 to 5; in the formula (6);

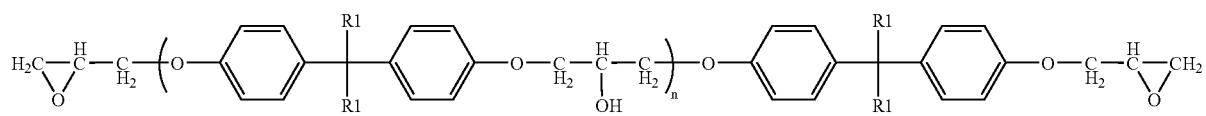

(7)

wherein R1 represents a hydrogen atom or a hydrocarbon group with 4 or less carbon atoms and may be the same or different; and 'n' represents a mean value that is a positive number of from 0 to 5; in the formula (7).

In the resin composition for semiconductor encapsulation according to the present invention, it is preferable that the curing accelerator (D) is at least one member selected from the group consisting of a compound represented by formula (8), a compound represented by formula (9), and a compound represented by formula (10):

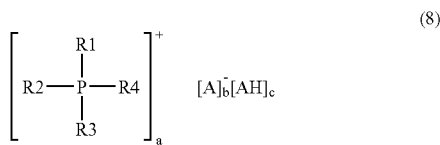

wherein 'P' represents a phosphorus atom; each of R1, R2, R3 and R4 represents a substituted or unsubstituted aromatic group or a substituted or unsubstituted alkyl group and may be the same or different; 'A' represents an anion of an aromatic organic acid having, on the aromatic ring, at least one functional group selected from the group consisting of a hydroxyl group, a carboxyl group, and a thiol group; 'AH' represents an aromatic organic acid having, on the aromatic ring, at least one group selected from the group consisting of a hydroxyl group, a carboxyl group, and a thiol group; each of 'a' and 'b' represents an integer of from 1 to 3; 'c' represents an integer of from 0 to 3; and 'a' and 'b' are equal; in the formula (8);

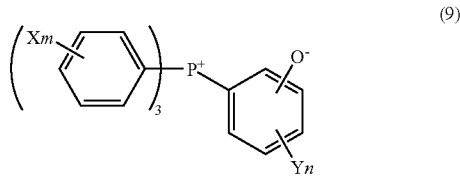

wherein 'X' represents a hydrogen atom or an alkyl group with 1 to 3 carbon atoms; 'Y' represents a hydrogen atom or a hydroxyl group; each of 'm' and 'n' represents an integer of from 1 to 3; in the formula (9);

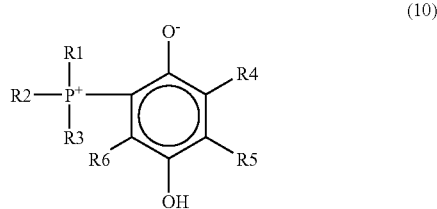

wherein 'P' represents a phosphorus atom; each of R1, R2, and R3 represents a substituted or unsubstituted alkyl group with 1 to 12 carbon atoms or a substituted or unsubstituted aryl group with 6 to 12 carbon atoms and may be the same or different; each of R4, R5 and R6 represents a hydrogen atom or a hydrocarbon group with 1 to 12 carbon atoms and may be the same or different; and R4 and R5 may be combined so as to form a ring structure; in the formula (10).

The resin composition for semiconductor encapsulation according to the present invention further comprises (E) a silane coupling agent and (F) a compound comprising an aromatic ring having two or more hydroxyl groups bound respectively to two or more adjoining carbon atoms constituting the aromatic ring.

In the resin composition for semiconductor encapsulation according to the present invention, it is more preferable that the compound (F) is a compound comprising an aromatic ring having two hydroxyl groups bound respectively to two adjoining carbon atoms constituting the aromatic ring.

In the resin composition for semiconductor encapsulation according to the present invention, it is preferable that the compound (F) is a compound comprising a naphthalene ring having two or more hydroxyl groups bound respectively to two or more adjoining carbon atoms constituting the naphthalene ring.

In the resin composition for semiconductor encapsulation according to the present invention, it is more preferable that the compound (F) is a compound comprising a naphthalene ring having two hydroxyl groups bound respectively to two adjoining carbon atoms constituting the naphthalene ring.

In the resin composition for semiconductor encapsulation according to the present invention, it is preferable that the compound (F) is contained in an amount of 0.01 wt % or more by weight relative to the total amount of the resin composition.

In the resin composition for semiconductor encapsulation according to the present invention, it is preferable that the silane coupling agent (E) is contained in an amount of 0.01 to 1 wt % by weight relative to the total amount of the resin composition.

In the resin composition for semiconductor encapsulation according to the present invention, it is preferable that the inorganic filler (C) is contained in an amount of 80 to 92 wt % by weight relative to the total amount of the resin composition.

The semiconductor device according to the present invention is formed by employing the resin composition for semiconductor encapsulation according to the present invention to package a semiconductor element included therein.

According to the present invention, there is obtained a resin composition for semiconductor encapsulation realizing excellent soldering resistance and flame resistance and having excellent flowability and curing properties.

Particularly when the above-mentioned specific compound having two or more phenolic hydroxyl groups in its molecule or the above-mentioned specific crystalline epoxy resin is used, a resin composition having good balance between low warpage and flowability in an area surface-mounted semiconductor package can be obtained.

According to the present invention, there is obtained a highly reliable semiconductor device by using lead-free solder without using a flame retardant such as a Br compound or antimony oxide in consideration of an environmental problem.

Figure 1:
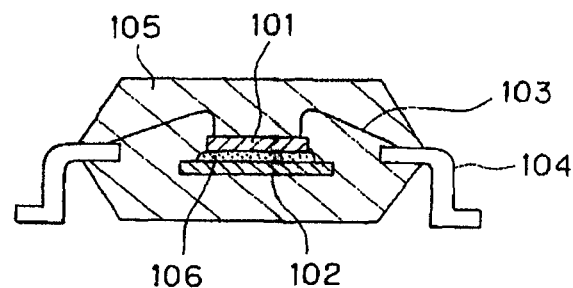
FIG. 1 is a view showing a cross-sectional structure of one example of a semiconductor device using the epoxy resin composition according to the present invention.

The sign in each figure refers to the following: a semiconductor element (101), a die pad (102), gold wires (103), lead frames (104), an encapsulating resin (105), a cured die bonding material (106), a semiconductor element (201), a substrate (202), gold wires (203), wirings (204), an encapsulating resin (205), solder balls (206), a cured die bonding material (207), gold wire (301).

DETAILED DESCRIPTION OF THE INVENTION

In the present invention, an epoxy resin composition realizing excellent soldering resistance and flame resistance and having excellent flowability and curing properties is obtained by comprising (A) an epoxy resin containing (a) an epoxy resin represented by formula (1), (B) a compound having two or more phenolic hydroxyl groups in its molecule, (C) an inorganic filler, and (D) a curing accelerator:

epoxy resin (A) containing the epoxy resin (a), is excellent in flowability and curing properties, and its cured product has low water absorption and low elasticity modulus in the range of higher temperatures than the glass transition temperature (referred to hereinafter as Tg), thus improving soldering resistance. The cured product of the epoxy resin composition is characterized by being excellent in flame retardancy and having high Tg in spite of low crosslinkage density. In the formula (1), R1 and R2 and two oxygen atoms bound respectively to the condensed ring may be bound to any sites at which they can be bound to the condensed ring. The epoxy resin (a) of formula (1) used in the present invention includes, for example, the resin represented by formula (11), but is not particularly limited insofar as it has the structure of formula (1).

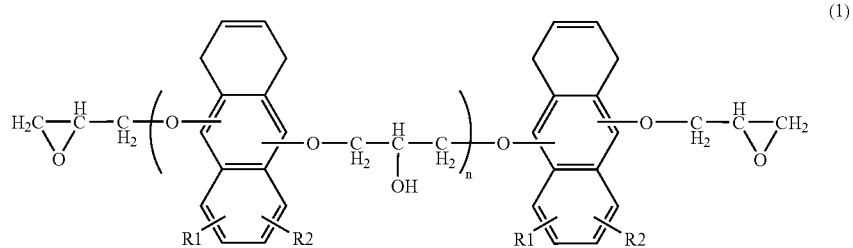

(1)

wherein each of R1 and R2 represents a hydrogen atom or a hydrocarbon group with 4 or less carbon atoms and may be the same or different; and 'n' represents a mean value that is a positive number of from 0 to 5; in the formula (1).

Hereinafter, the present invention is described in detail.

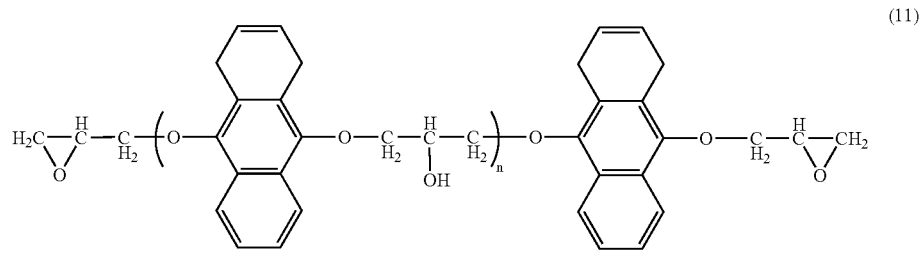

(11)

The epoxy resin (a) of formula (1) used in the present invention has, between epoxy groups, hydrophobic and rigid structures similar to anthracene, and has a larger number of aromatic structures than aliphatic structures in its molecular structure. The epoxy resin (a) acts as resin of low viscosity because of its low molecular weight. Accordingly, the epoxy resin composition obtained by combining the compound (B) having two or more phenolic hydroxyl groups in its molecule, the inorganic filler (C) and the curing accelerator (D), with the wherein 'n' represents a mean value that is a positive number of from 0 to 5.

In the epoxy resin (a) represented by the formula (1), the component having a structure of formula (1) with n equal to 0 (zero) is contained in an amount of preferably 80% or more, more preferably 85% or more, based on the whole of the epoxy resin (a). When the ratio of the component having a structure with n equal to 0 (zero) is in the range described above, the increase in the viscosity of the resin composition caused by a small amount of the low-molecular component can be prevented. In the present invention, the ratio, to the epoxy resin, of the component having a structure with n equal to 0 (zero) is expressed in area % measured by liquid chromatography. This area % is correlated with weight. Liquid chromatography measurement can be conducted for example under the following measurement conditions: The liquid chromatographic unit is SC-8010 manufactured by Tosoh Corporation; column, TSK-GEL ODS-120T (4.6×250) manufactured by Tosoh Corporation; column temperature, 40° C.; UV detection wavelength, 280 nm; flow rate, 1.0 ml/min.; gradient, water/acetonitrile changed over 60 minutes from 60/40 to 0/100 and kept at 0/100 for 20 minutes.

The hydrolyzable chlorine content of the epoxy resin (a) is preferably 300 ppm or less, more preferably 150 ppm or less. When the hydrolyzable chlorine content is in the range described above, the resin composition can prevent generation of failure in moisture resistance reliability and has particularly excellent soldering resistance. In the present invention, the hydrolyzable chlorine content can be determined according to JIS K 7236, and refers to a concentration determined by reacting chlorine in the epoxy resin with a solution of KOH and measuring generated KCl with an aqueous solution of silver nitrate.

In the present invention, the epoxy resin (a) represented by the formula (1) can be used in combination with another epoxy resin in such a range that the effect of the epoxy resin (a) is not deteriorated. The epoxy resin which can be simultaneously used includes, for example, biphenyl type epoxy resin, bisphenol type epoxy resin, stilbene type epoxy resin, phenol novolak type epoxy resin, cresol novolak type epoxy resin, triphenol methane type epoxy resin, phenol aralkyl type epoxy resin containing phenylene structure, phenol aralkyl type epoxy resin containing biphenylene structure, naphthol novolak type epoxy resin, naphthol aralkyl type epoxy resin containing phenylene structure, naphthol aralkyl type epoxy resin containing biphenylene structure, alkyl modified triphenol methane type epoxy resin, epoxy resin containing triazine nucleus, dicyclopentadiene modified phenol type epoxy resin. In consideration of the moisture resistance reliability of the resin composition for semiconductor encapsulation, the simultaneously used epoxy resin is the one wherein Na ions and Cl ions as ionic impurities are preferably as low as possible, and from the viewpoint of curing properties, the epoxy equivalent is preferably 100 to 500 g/eq.

When the epoxy resin is simultaneously used, the ratio of the epoxy resin (a) represented by the formula (1) to the whole of the epoxy resin (A) compounded is preferably 10 wt % or more, more preferably 30 wt % or more, still more preferably 50 wt % or more. When the ratio is less than the lower limit, the effect of low water absorption and the effect of low viscosity may be reduced.

As the epoxy resin used in combination with the epoxy resin (a) represented by the formula (1) in the present invention, a crystalline epoxy resin (a') which is at least one member selected from the group consisting of (a'-1) an epoxy resin represented by formula (6) and (a'-2) an epoxy resin represented by formula (7) is preferably used. The epoxy resin (a'-1) represented by the formula (6) and the epoxy resin (a'-2) represented by the formula (7) used in the present invention are characterized by being a crystalline epoxy resin, being solid at ordinary temperatures and excellent in handling ability, and having very low melt viscosity at the time of molding. Such crystalline epoxy resin (a') has lower melt viscosity than that of the epoxy resin (a) represented by the formula (1), and can thus be simultaneously used to increase the content of the inorganic filler (C) in the epoxy resin composition, resulting in further improvement in low warpage. Even by such formulation, there is an advantage that the composition has high flowability and reduces displacement of gold wires in a semiconductor device.

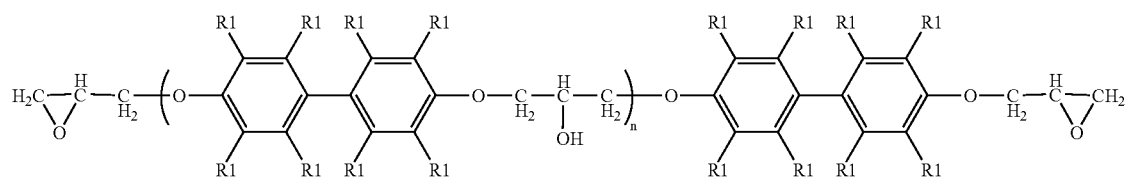

(6)

wherein R1 represents a hydrogen atom or a hydrocarbon group with 4 or less carbon atoms and may be the same or different; and 'n' represents a mean value that is a positive number of from 0 to 5; in the formula (6).

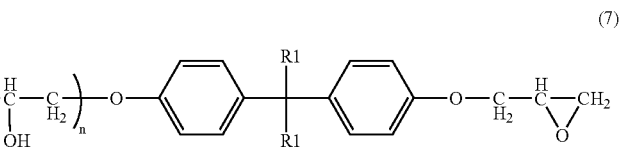

(7)

wherein R1 represents a hydrogen atom or a hydrocarbon group with 4 or less carbon atoms and may be the same or different; and 'n' represents a mean value that is a positive number of from 0 to 5; in the formula (7).

The epoxy resin (a'-1) represented by the formula (6) is preferably 4,4'-diglycidyl biphenyl or 3,3',5,5,-tetramethyl-4,4'-diglycidyl biphenyl or a melt mixture of the two, which has good balance between workability and practical usability.

The epoxy resin (a'-2) represented by the formula (7) is preferably a bisphenol type epoxy resin wherein the component having the structure with n equal to 0 (zero) is contained in an amount of 90% or more. The melting point is preferably 35° C. to 60° C., more preferably 40° C. to 50° C. When the melting point is in the range described above, the deterioration in handling workability and the reduction in storage stability of the resin composition at ordinary temperatures, caused by blocking of the resin at ordinary temperatures, can be prevented, and an increase in viscosity by which the high loading of the inorganic filler is hindered can be suppressed. The melting point of the epoxy resin in the present invention refers to the temperature at the top of a melting peak when measured at an increasing temperature at a rate of 5° C./min. from ordinary temperature with a differential scanning calorimeter (manufactured by Seiko Instruments Inc.).

When the epoxy resin (a) represented by the formula (1) is used in combination with the crystalline epoxy resin (a') which is at least one member selected from the group consisting of the epoxy resin (a'-1) represented by the formula (6) and the epoxy resin (a'-2) represented by the formula (7), the crystalline epoxy resin (a') is contained preferably in an amount of 20 to 80 wt % relative to the total amount of the epoxy resin (A) in order to bring out the maximum properties of the crystalline epoxy resin (a'). When the ratio of the crystalline epoxy resin (a') is in the range described above, the effect of the crystalline epoxy resin (a') on reduction of viscosity and the effect of the epoxy resin (a) of formula (1) on increase of Tg and improvement of flame resistance can be obtained with good balance.

The amount of the epoxy resin (A) compounded is not particularly limited, but can be for example 4 to 12 wt % based on the whole of the epoxy resin composition.

The molecular weight and molecular structure of the compound (B) having two or more phenolic hydroxyl groups in its molecule used in the present invention are not particularly limited, but preferably the compound (B) comprises a compound represented by the formula (2):

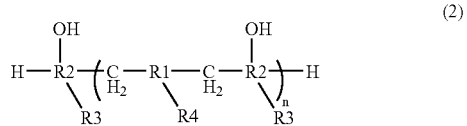

(2)

wherein R1 represents a phenylene group, a biphenylene group, a naphthylene group or a hydroxy phenylene group; R2OH represents a phenol, α-naphthol, or β-naphthol; each of R3 and R4 is a group bonded to each of R2 and R1 and represents a hydrogen atom or a hydrocarbon group with 10 or less carbon atoms, and may be the same or different; and 'n' represents a mean value that is a positive number of from 1 to 10; in the formula (2).

When the compound represented by the formula (2) is a compound wherein R1 is a phenylene group, a biphenylene group or a naphthylene group, the compound has an aralkyl group having hydrophobic phenylene, biphenylene or naphthylene structure (—CH$_2$—R1-CH$_2$—) between phenolic hydroxyl groups, and thus the distance between crosslinked sites is prolonged. Accordingly, a cured product of the epoxy resin composition using the same is rendered low elastic at high temperatures and reduces water absorption. By exhibiting these properties, the compound of formula (2) can contribute to improvement of soldering resistance. Further, the cured product is characterized by being excellent in flame retardancy and having high heat resistance in spite of low crosslinkage density. Further, the compound having naphthylene structure can reduce warpage in an area surface-mounted semiconductor package, by the increase in Tg due to rigidity attributable to the naphthalene ring or by the decrease in linear expansion coefficient due to intermolecular interaction attributable to its planar structure. When the compound represented by the formula (2) is a compound wherein R1 is a hydroxy phenylene group, the compound has a large number of phenolic hydroxyl groups, and thus a cured product of the epoxy resin composition using the same can have high crosslinkage density and high Tg, to reduce warpage.

In the compound represented by the formula (2), the aromatic group having a phenolic hydroxyl group (—R2 (OH)—) may be phenol, α-naphthol or β-naphthol. Particularly when the aromatic group is naphthol, the compound can achieve an effect of reducing warpage by increase in Tg or decrease in linear expansion coefficient, and can further realize improvement of flame retardancy due to the presence of a large number of aromatic carbon atoms, in a similar way to the above-mentioned compound having naphthylene structure.

Examples of the compound of formula (2) used in the present invention include, but are not limited to, the following compounds.

For examples, compounds represented by formula (3) below are mentioned. The compounds represented by the formula (3) include, but are not limited to, a phenol aralkyl resin containing phenylene structure and a phenol aralkyl resin containing biphenylene structure. When the compound represented by the formula (3) is used, its cured product is characterized by being highly resistant to heat, excellent in soldering resistance, excellent in adhesion to a semiconductor element, an organic substrate and a metallic substrate, and excellent in flame retardancy, in spite of low crosslinkage density.

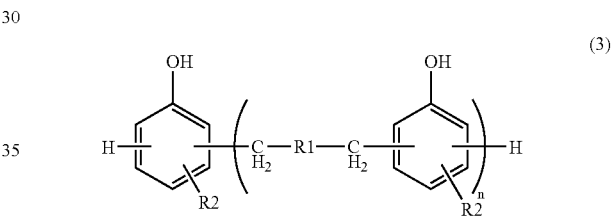

(3)

wherein R1 represents a phenylene group or a biphenylene group; R2 represents a hydrogen atom or a hydrocarbon group with 4 or less carbon atoms and may be the same or different; and 'n' represents a mean value that is a positive number of from 1 to 5; in the formula (3).

Moreover, for example, compounds represented by formula (4) below are mentioned. The compounds represented by the formula (4) include, but are not limited to, a naphthol aralkyl resin containing phenylene structure. When the compound represented by the formula (4) is used, its cured product realizes excellent soldering resistance and flame resistance which are attributable to the naphthalene ring as described above, and realizes low warpage in an area surface-mounted semiconductor package.

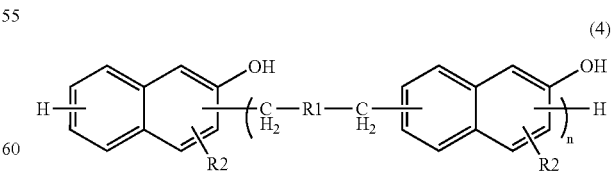

(4)

wherein R1 represents a phenylene group or a biphenylene group; R2 represents a hydrogen atom or a hydrocarbon group with 4 or less carbon atoms and may be the same or different; and 'n' represents a mean value that is a positive number of from 1 to 10; in the formula (4).

Furthermore, for example, compounds represented by formula (5) below are mentioned. The compounds represented by the formula (5) include, but are not limited to, phenol novolak resin and cresol novolak resin. When the compound represented by the formula (5) is used, its cured product has high crosslinkage density and high Tg, to realize low warpage in an area surface-mounted semiconductor package.

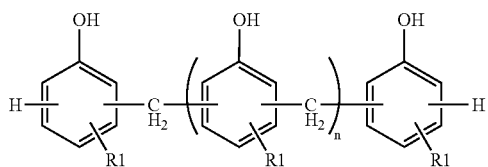
(5)

wherein R1 represents a hydrogen atom or a hydrocarbon group with 4 or less carbon atoms and may be the same or different; and 'n' represents a mean value that is a positive number of from 0 to 8; in the formula (5).

Among the compounds represented by the formula (5) used in the present invention, those compounds having weight average molecular weight within a range of 400 to 600, polydispersity ratio ((Mw)/(Mn)) of weight average molecular weight (Mw) to number average molecular weight (Mn) within a range of 1.4 or less, and softening point within a range of 60 to 70° C. are preferable for realization of both excellent flowability and curing properties with less deterioration in curing properties regardless of low viscosity. A method of producing such a specific compound represented by the formula (5), unlike conventional methods, involves polymerizing phenols and formaldehydes in a suspended state with phases separated in an aqueous solution of phosphoric acid. Its details are in accordance with WO 03/042267 and WO 2004/020492. The compound of the formula (5) produced by this method is characterized by the narrow distribution of its molecular weights with a significantly low content of monomers of phenols and a low content of a high molecular-weight component, and has a lower viscosity than that of usual phenol resin with the softening point given as a standard. An epoxy resin composition using the compound of the formula (5) with the narrow distribution of molecular weights can exhibit properties excellent in flowability without deteriorating curing properties. The weight average molecular weight is more preferably 450 to 550. When the weight average molecular weight is lower than 400, warpage and deterioration in curing properties may be observed, while when the weight average molecular weight is higher than 600, the viscosity may be increased. When the polydispersity ratio ((Mw)/(Mn)) of weight average molecular weight (Mw) to number average molecular weight (Mn) is higher than 1.4, it is meant that the distribution of molecular weights is broadened, so viscosity characteristics may be unfavorably varied. When the softening point is lower than 60° C., warpage and deterioration in curing properties may be observed, while when the softening point is higher than 70° C., the viscosity may be increased.

In the present invention, another compound having two or more phenolic hydroxyl groups in its molecule can be simultaneously used in such a range that the effect of the compound of formula (2) used is not deteriorated. The simultaneously usable compound having two or more phenolic hydroxyl groups in its molecule includes, for example, triphenol methane type phenol resin, terpene modified phenol resin, dicyclopentane modified phenol resin. From the viewpoint of curing properties, the hydroxyl group equivalent is preferably 90 g/eq. to 250 g/eq.

The ratio of the compound represented by the formula (2) to the whole of the compound having two or more phenolic hydroxyl groups in its molecule (B) compounded is preferably 10 wt % or more, more preferably 30 wt % or more, still more preferably 50 wt % or more, from the viewpoint of improving soldering resistance and reducing warpage.

The amount of the compound having two or more phenolic hydroxyl groups in its molecule (B) compounded is not particularly limited, but can be for example 3 to 11 wt % based on the whole of the epoxy resin composition.

The inorganic filler (C) used in the present invention includes fused silica, spherical silica, crystalline silica, alumina, silicon nitride and aluminum nitride, and spherical fused silica is most preferably used. In consideration of loading into a mold, the particle diameter of the inorganic filler is desirably 0.01 μm to 150 μm. These inorganic fillers may be used alone or as a mixture thereof. The amount of the inorganic filler (C) compounded is preferably 80 wt % to 92 wt % based on the whole of the epoxy resin composition. When the amount of the inorganic filler (C) compounded is in the range described above, the reduction in soldering resistance caused by a reduction in strength accompanying an increase in the amount of water adsorbed, or an increase in warpage in an area surface-mounted semiconductor package, can be suppressed without deteriorating the flowability of the epoxy resin composition.

The curing accelerator (D) used in the present invention may be the one accelerating the reaction of an epoxy group of epoxy resin with a phenolic hydroxyl group, and a curing accelerator used generally in an epoxy resin composition as an encapsulating compound for a semiconductor element can be utilized. Specific examples include a phosphorus-containing compound such as an organic phosphine, a tetra-substituted phosphonium compound, a phosphobetaine compound, and a phosphine compound/quinone compound adduct, and a nitrogen-containing compound such as 1,8-diazabicyclo (5.4.0) undecene-7, benzyl dimethyl amine, 2-methyl imidazole. Among these compounds, the phosphorus-containing compound is preferable, and in consideration of flowability, the tetra-substituted phosphonium compound is preferable, and in consideration of lower elasticity modulus of a cured product of the epoxy resin composition at high temperatures, the phosphobetaine compound and the phosphine compound/quinone compound adduct are more preferable.

The organic phosphine includes, for example, primary phosphines such as ethyl phosphine and phenyl phosphine, secondary phosphines such as dimethyl phosphine and diphenyl phosphine, and tertiary phosphines such as trimethyl phosphine, triethyl phosphine, tributyl phosphine and triphenyl phosphine.

The tetra-substituted phosphonium compound includes, for example, compounds represented by formula (8):

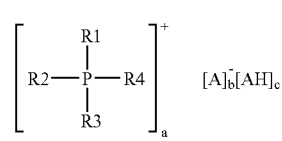
(8)

wherein 'P' represents a phosphorus atom; each of R1, R2, R3 and R4 represents a substituted or unsubstituted aromatic group or a substituted or unsubstituted alkyl group and may be the same or different; 'A' represents an anion of an aromatic organic acid having, on the aromatic ring, at least one functional group selected from the group consisting of a hydroxyl group, a carboxyl group, and a thiol group; 'AH' represents an aromatic organic acid having, on the aromatic ring, at least one group selected from the group consisting of a hydroxyl group, a carboxyl group, and a thiol group; each of 'a' and 'b' represents an integer of from 1 to 3; 'c' represents an integer of from 0 to 3; and 'a' and 'b' are equal; in the formula (8).

The compound represented by the formula (8) is obtained for example in the following manner. First, tetra-substituted phosphonium bromide, an aromatic organic acid and a base are uniformly mixed with an organic solvent, to generate an anion of the aromatic organic acid in the solution system. Then, water is added thereto. Thus, the compound represented by the formula (8) can be precipitated. The compound represented by the formula (8) is preferably a compound wherein each of R1, R2, R3 and R4 bound to a phosphorus atom is a phenyl group; AH is a compound having a hydroxyl group on its aromatic ring, that is, phenols; and A is an anion of the phenols.

The phosphobetaine compound includes compounds represented by the following formula (9):

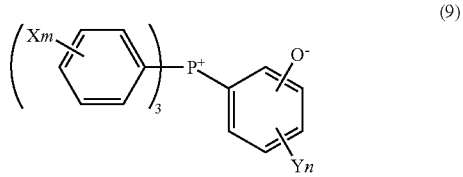

(9)

wherein 'X' represents a hydrogen atom or an alkyl group with 1 to 3 carbon atoms; 'Y' represents a hydrogen atom or a hydroxyl group; each of 'm' and 'n' represents an integer of from 1 to 3; in the formula (9).

The compound represented by the formula (9) is obtained for example in the following manner. The compound is obtained through a step of first reacting a tertiary phosphine i.e. a tri-aromatic substituted phosphine with a diazonium salt to substitute the tri-aromatic substituted phosphine for a diazonium group of the diazonium salt. However, the process is not limited thereto.

The phosphine compound/quinone compound adduct includes, for example, compounds represented by the following formula (10):

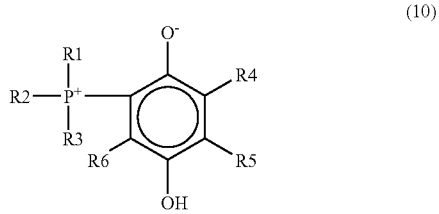

(10)

wherein 'P' represents a phosphorus atom; each of R1, R2, and R3 represents a substituted or unsubstituted alkyl group with 1 to 12 carbon atoms or a substituted or unsubstituted aryl group with 6 to 12 carbon atoms and may be the same or different; each of R4, R5 and R6 represents a hydrogen atom or a hydrocarbon group with 1 to 12 carbon atoms and may be the same or different; and R4 and R5 may be combined so as to form a ring structure; in the formula (10).

The phosphine compound used in the phosphine compound/quinone compound adduct is preferably the one having an aromatic ring unsubstituted or substituted with a substituent group such as an alkyl group or an alkoxy group wherein an organic group such as the alkyl group or alkoxy group has 1 to 6 carbon atoms, and preferable examples include triphenyl phosphine, tris(alkylphenyl)phosphine, tris (alkoxyphenyl)phosphine, trinaphthyl phosphine, and tris (benzyl)phosphine. From the viewpoint of availability, triphenyl phosphine is preferable.

The quinone compound used in the phosphine compound/quinone compound adduct includes, for example, o-benzoquinone, p-benzoquinone, anthraquinone or derivatives thereof. Among them, p-benzoquinone is preferable from the viewpoint of storage stability.

A method of producing the phosphine compound/quinone compound adduct involves contacting and mixing an organic tertiary phosphine and a quinone compound with each other in a solvent in which the two can be dissolved, whereby the adduct can be obtained. The solvent is preferably a ketone such as acetone or methyl ethyl ketone in which the solubility of the adduct is low. However, the solvent is not limited thereto.

The compound represented by the formula (10) is preferably a compound wherein each of R1, R2 and R3 bound to a phosphorus atom is a phenyl group, and each of R4, R5 and R6 is a hydrogen atom, that is, a compound comprising 1,4-benzoquinone and triphenyl phosphine added to each other.

The amount of the curing accelerator (D) used in the present invention is 0.1 wt % to 1 wt % based on the whole of the epoxy resin composition. When the amount of the curing accelerator incorporated is in the range described above, desired curing properties can be obtained without deteriorating flowability.

Examples of the silane coupling agent (E) used in the present invention include silane coupling agents including an epoxy group, an amino group, an ureido group, or a mercapto group, or the like, but is not particularly limited insofar as it can react between the epoxy resin composition and the inorganic filler to improve interface adhesion strength between the epoxy resin composition and the inorganic filler. The compound comprising an aromatic ring having two or more hydroxyl groups bound respectively to two or more adjoining carbon atoms constituting the aromatic ring (F) used in the present invention (also referred to hereinafter as compound (F)) inhibits the reaction of the curing accelerator (D) during storage and improves storage stability to significantly improve viscosity characteristics and flowability, by the synergistic effect thereof with the silane coupling agent (E), and thus the silane coupling agent (E) is essential for sufficiently obtaining the effect of the compound (F). By using the silane coupling agent (E) and the compound (F) simultaneously, the viscosity is hardly increased and the flowability is maintained, and thus the amount of the inorganic filler (C) can be increased, and in this case, the soldering resistance, flame resistance and low warpage can further be improved. By using the silane coupling agent (E) and the compound (F) simultaneously, the epoxy resin composition is also made excellent in storage stability at ordinary temperatures.

These silane coupling agents (E) may be used alone or as a mixture thereof. The amount of the silane coupling agent (E) used in the present invention is preferably 0.01 wt % to 1 wt %, more preferably 0.05 wt % to 0.8 wt %, still more preferably 0.1 wt % to 0.6 wt %, based on the whole of the epoxy resin composition. When the amount of the silane coupling agent (E) incorporated is in the range described above, the viscosity characteristics and flowability can be improved by the synergistic effect thereof with the compound (F), and the reduction in soldering resistance in a semiconductor package caused by an increase in the water absorption of the epoxy resin composition can be prevented.

The compound comprising an aromatic ring having two or more hydroxyl groups bound respectively to two or more adjoining carbon atoms constituting the aromatic ring (F) used in the present invention may have a substituent group other than the hydroxyl groups. As the compound (F), the monocyclic compound represented by the following formula (12) or the polycyclic compound represented by the following formula (13) can be used.

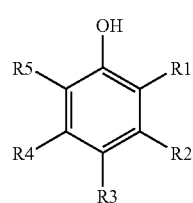

(12)

wherein one of R1 and R5 is a hydroxyl group, and when one of R1 and R5 is a hydroxyl group, the other is a hydrogen atom, a hydroxyl group or a substituent group other than a hydroxyl group; and each of R2, R3 and R4 is a hydrogen atom, a hydroxyl group or a substituent group other than a hydroxyl group; in the formula (12).

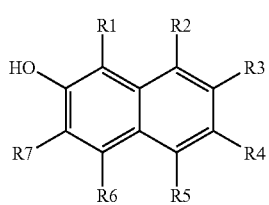

(13)

wherein one of R1 and R7 is a hydroxyl group, and when one of R1 and R7 is a hydroxyl group, the other is a hydrogen atom, a hydroxyl group or a substituent group other than a hydroxyl group; and each of R2, R3, R4, R5 and R6 is a hydrogen atom, a hydroxyl group or a substituent group other than a hydroxyl group; in the formula (13).

Specific examples of the monocyclic compound represented by the formula (12) include catechol, pyrogallol, gallic acid, gallic acid esters, and derivatives thereof.

Specific examples of the polycyclic compound represented by the formula (13) include 1,2-dihydroxy naphthalene, 2,3-dihydroxy naphthalene, and derivatives thereof. Among these compounds, the compound comprising an aromatic ring having two hydroxyl groups bound respectively to two adjoining carbon atoms constituting the aromatic ring is preferable from the viewpoint of easy control of flowability and curing properties. In consideration of sublimation in the kneading step, the compound is more preferably a compound whose nucleus is a naphthalene ring of low volatility and high weighing stability. Specifically, the compound (F) in this case can be for example a compound having a naphthalene ring, such as 1,2-dihydroxy naphthalene, 2,3-dihydroxy naphthalene and a derivative thereof. These compounds (F) may be a mixture of two or more thereof.

The amount of the compound (F) incorporated is preferably 0.01 wt % to 1 wt %, more preferably 0.03 wt % to 0.8 wt %, still more preferably 0.05 wt % to 0.5 wt %, based on the whole of the epoxy resin composition. When the amount of the compound (F) incorporated is in the range described above, the viscosity characteristics and flowability can be improved by the synergistic effect thereof with the silane coupling agent (E), and a reduction in the curing properties of the epoxy resin composition and a reduction in the physical properties of its cured product can be prevented.

Although the epoxy resin composition of the present invention comprises the components (A) to (F) as essential components, it may further contain if necessary with various additives, for example release agents such as naturally occurring wax such as carnauba wax, synthetic wax such as polyethylene wax, higher fatty acids such as stearic acid and zinc stearate and metal salts thereof, or paraffin; coloring agents such as carbon black and red oxide; low-stress additives such as silicone oil, silicone rubber etc.; and inorganic ion exchanges such as bismuth oxide hydrate.

The epoxy resin composition of the present invention can be produced by homogeneously mixing components (A) to (F) and other additives by a mixer or the like at ordinary temperatures, then melt-kneading the mixture by a heat roll, a kneader, an extruder or the like and cooling the product, followed by grinding it.

FIG. 1 is a view showing a cross-sectional structure of one example of a semiconductor device comprising a semiconductor element encapsulated with the resin composition for semiconductor encapsulation according to the present invention. A semiconductor element 101 is fixed via a cured die bonding material 106 on a die pad 102. The semiconductor element 101 is connected via gold wires 103 to lead frames 104. The semiconductor element 101 is encapsulated with an encapsulating resin 105.

Figure 2:
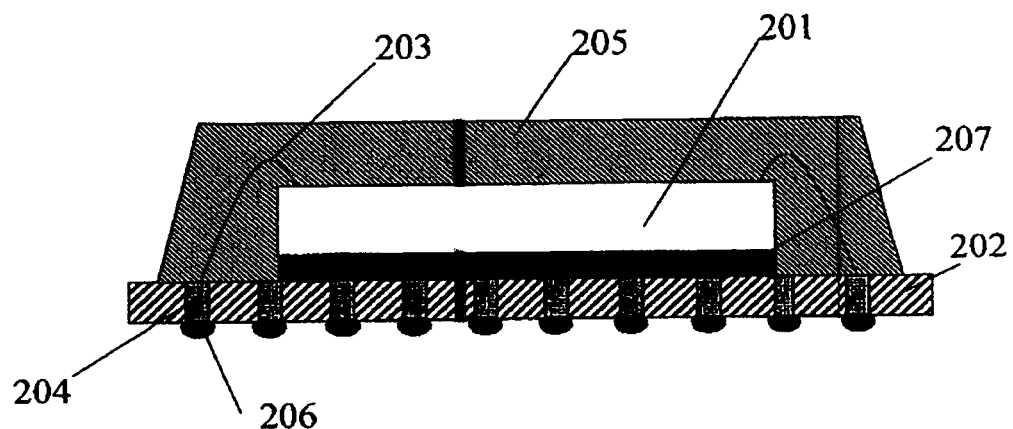
FIG. 2 is a view showing a cross-sectional structure of another example of a semiconductor device using the epoxy resin composition according to the present invention.

FIG. 2 is a view showing a cross-sectional structure of another example of a semiconductor device comprising a semiconductor element encapsulated with the resin composition for semiconductor encapsulation according to the present invention. A semiconductor element 201 is mounted via a cured die bonding material 207 on one side of substrate 202, and substantially the only one side of the substrate on which the semiconductor element 201 was mounted is encapsulated with an encapsulating resin 205. Wirings 204 arranged in the substrate 202 are connected via gold wires 203 to the semiconductor element 201. On the opposite side to the element-mounted side of the substrate 202, solder balls 206 are formed in parallel so as to be connected to the wirings 204.

These semiconductor devices are obtained by using, as the encapsulating resin 105 or 205, the epoxy resin composition of the present invention constituted as described above and molding it by a conventional molding method such as transfer molding, compression molding or injection molding.

EXAMPLES

Hereinafter, the examples of the present invention are provided, but should not be construed to limit the invention in any way. The compounding ratio is expressed in parts by weight.

Example Series I

Example I-1

The following components were mixed at ordinary temperatures by a mixer, melted and kneaded by a heating roll at 80 to 100° C., cooled and ground to give an epoxy resin composition. The evaluation results are shown in Table 1.

| | |
|---|---|
| Epoxy resin 1: Epoxy resin (a) of the formula (11) (epoxy equivalent 180; melting point 105° C.; the ratio of the component having a structure of the formula (11) with n equal to 0(zero) was 85% based on the whole of the resin; hydrolyzable chlorine content, 100 ppm) | 6.0 parts by weight |
| Phenol resin 1: Phenol aralkyl resin containing biphenylene structure; a compound represented by the formula (2) or (3) (MEH-7851SS manufactured by Meiwa Plastic Industries, Ltd., hydroxyl group equivalent 203, softening point 66° C., represented by formula (2) wherein R1 is a biphenylene group, R2OH is phenol, R3 is a hydrogen atom, and R4 is a hydrogen atom, or formula (3) wherein R1 is a biphenylene group and R2 is a hydrogen atom) | 6.7 parts by weight |
| Fused spherical silica (average particle diameter 30 μm) | 86.0 parts by weight |
| Curing accelerator 1, triphenyl phosphine | 0.2 part by weight |
| Coupling agent 1, γ-glycidylpropyltrimethoxy silane | 0.6 part by weight |
| 2,3-Dihydroxy naphthalene | 0.05 part by weight |
| Carnauba wax | 0.2 part by weight |
| Carbon black | 0.3 part by weight |

[Evaluation]

*Spiral flow: Using a low-pressure transfer molding machine, the epoxy resin composition was injected into a mold for spiral flow measurement in accordance with EMMI-1-66 under the conditions of a mold temperature of 175° C., a transfer pressure of 6.9 MPa and a retention time of 120 seconds, and then measured for flow length. The spiral flow is a parameter of flowability, and higher spiral flow is indicative of excellent flowability. The unit is cm.

*Curing torque ratio: Using Curelastometer (JSR Curelastometer IVPS manufactured by ORIENTEC Co., Ltd.), the torque was determined at a mold temperature of 175° C., 90 seconds and 300 seconds after heating was initiated, and the curing torque ratio (torque after 90 seconds)/(torque after 300 seconds) was calculated. The torque determined by the Curelastometer is a parameter of thermal rigidity, and a higher curing torque ratio is indicative of excellent curing properties. The unit is %.

*Water absorption: Using a transfer molding machine, a molded product of 50 mm in diameter and 3 mm in thickness was molded at a mold temperature of 175° C., at a transfer pressure of 7.4 MPa for a curing time of 2 minutes, and then post-cured at 175° C. for 8 hours, and the resulting molded product was subjected to humidification treatment for 168 hours under the environment of 85° C. and 85% relative humidity, and then measured for weight change to determine water absorption. The unit is % by weight.

*Flame resistance: Using a transfer molding machine, a flame retardant test specimen of 3.2 mm in thickness was formed at a mold temperature of 175° C. for a transfer time of 15 seconds and a curing time of 120 seconds at a transfer pressure of 9.8 MPa, and then tested for flame retardancy in accordance with the specification of UL94 (vertical method).

<<Evaluation Standards>>

In:
1) afterflame time of each test specimen,
2) sum of afterflame time of 5 specimens,
3) sum of afterflame time and flameless burning time of each test specimen after the second flame contact,
4) presence or absence of afterflame or flameless burning up to holding clamp of each test specimen, and
5) presence or absence of ignition of cotton caused by flame-emitting particles or droplet from the test specimen, V-0: 1) 10 seconds or less, 2) 50 seconds or less, 3) 30 seconds or less, 4) absent, 5) absent,
V-1: 1) 30 seconds or less, 2) 250 seconds or less, 3) 60 seconds or less, 4) absent, 5) absent, and
V-2: 1) 30 seconds or less, 2) 250 seconds or less, 3) 60 seconds or less, 4) absent, 5) present.
BO (Burnout): There are two or more test specimens where the afterflame time is 30 seconds or more.

*Soldering resistance: Using a low-pressure transfer molding machine, a frame having an Si chip of 6×6×0.30 mm bonded to 100 pQFP (Cu frame) with a body size of 14×14 ×1.4 mm was molded at a mold temperature of 175° C., for a transfer time of 10 seconds, for a curing time of 90 seconds and at a transfer pressure of 9.8 MPa, then post-cured under the conditions of 175° C. and 8 hours, subjected to humidification treatment under the conditions of 85° C., 85% and 48 hours, passed successively 3 times (10 seconds×3 times at 255° C. or more) through an IR reflow at a peak temperature of 260° C., and measured for the presence or absence of internal cracking and delamination by a scanning acoustic tomograph. Soldering resistance was judged in terms of the number of defective packages generating delamination of chip and/or internal cracking, per 10 packages.

Examples I-2 to I-17

Comparative Examples I-1 to I-3

According to the formulations in Tables 1 and 2, epoxy resin compositions were produced in the same manner as in Example I-1 and evaluated in the same manner as in Example I-1. The evaluation results are shown in Tables 1 and 2.

Components used other than those in Example I-1 are shown below.

Epoxy resin 2: Biphenyl type epoxy resin; epoxy resin (a'-1) of the formula (6) (YX-4000 HK manufactured by Japan Epoxy Resins Co., Ltd., melting point 105° C., epoxy equivalent 191, represented by the formula (6) wherein R1 are a methyl group in 3,3',5, and 5'position, and a hydrogen atom in remaining position)

Epoxy resin 3: Phenol aralkyl type epoxy resin containing biphenylene structure (NC-3000 manufactured by Nippon Kayaku Co., Ltd., softening point 56.5° C., epoxy equivalent 274)

Phenol resin 2: Phenol aralkyl resin containing phenylene structure, a compound represented by the formula (2) or (3) (XLC-4L manufactured by Mitsui Chemicals, Inc., softening point 65° C., hydroxyl group equivalent 165, represented by formula (2) wherein R1 is a phenylene group, R2OH is phenol, R3 is a hydrogen atom, and R4 is a hydrogen atom, or formula (3) wherein R1 is a phenylene group and R2 is a hydrogen atom)

Phenol resin 3: Phenol novolak resin, a compound represented by the formula (2) or (5) (softening point 80° C., hydroxyl group equivalent 105, represented by formula (2) wherein R1 is a hydroxy phenylene group, R2OH is phenol, R3 is a hydrogen atom, and R4 is a hydrogen atom, or formula (5) wherein R1 is a hydrogen atom)

Curing accelerator 2: 1,8-Diazabicyclo(5.4.0)undecene-7 (abbreviated hereinafter as DBU)

Curing accelerator 3: A curing accelerator represented by formula (14):

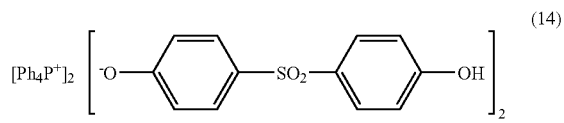

(14)

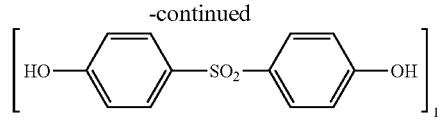

Curing accelerator 4: A curing accelerator represented by formula (15):

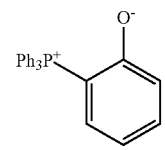

(15)

Coupling agent 2: γ-Mercaptopropyltrimethoxy silane 1,2-dihydroxy naphthalene catechol pyrogallol

TABLE 1

|  |  | Example (Series I) | | | | | | | | |
|---|---|---|---|---|---|---|---|---|---|---|
|  |  | 1 | 2 | 3 | 4 | 5 | 6 | 7 | 8 | 9 |
| (A) | Epoxy resin 1 (a) | 6.0 | 6.0 | 6.0 | 5.7 | 6.1 | 6.6 | 3.1 | 7.2 | 6.0 |
|  | Epoxy resin 2 (a'-1) |  |  |  |  |  |  | 3.1 |  |  |
| (B) | Phenol resin 1 | 6.7 | 6.8 | 6.7 | 6.5 | 6.9 |  | 6.7 | 2.8 | 6.8 |
|  | Phenol resin 2 |  |  |  |  |  | 6.2 |  |  |  |
|  | Phenol resin 3 |  |  |  |  |  |  |  | 2.8 |  |
| (C) | Fused spherical silica | 86.0 | 86.0 | 86.0 | 86.0 | 86.0 | 86.0 | 86.0 | 86.0 | 86.0 |
| (D) | Curing accelerator 1 | 0.2 | 0.2 | 0.2 | 0.2 | 0.2 | 0.2 | 0.2 | 0.2 | 0.2 |
|  | Curing accelerator 2 |  |  |  |  |  |  |  |  |  |
|  | Curing accelerator 3 |  |  |  |  |  |  |  |  |  |
|  | Curing accelerator 4 |  |  |  |  |  |  |  |  |  |
| (E) | Coupling agent 1 | 0.6 | 0.3 | 0.1 | 0.9 | 0.3 | 0.3 | 0.3 | 0.3 |  |
|  | Coupling agent 2 |  |  |  |  |  |  |  |  | 0.3 |
| (F) | 2,3-Dihydroxy naphthalene | 0.05 | 0.2 | 0.5 | 0.2 | 0.02 | 0.2 | 0.2 | 0.2 | 0.2 |
|  | 1,2-dihydroxy naphthalene |  |  |  |  |  |  |  |  |  |
|  | Catechol |  |  |  |  |  |  |  |  |  |
|  | Pyrogallol |  |  |  |  |  |  |  |  |  |
|  | Carnauba wax | 0.2 | 0.2 | 0.2 | 0.2 | 0.2 | 0.2 | 0.2 | 0.2 | 0.2 |
|  | Carbon black | 0.3 | 0.3 | 0.3 | 0.3 | 0.3 | 0.3 | 0.3 | 0.3 | 0.3 |
|  | Spiral flow [cm] | 110 | 100 | 95 | 102 | 108 | 112 | 135 | 95 | 111 |
|  | Curing torque ratio [%] | 55 | 55 | 55 | 56 | 54 | 58 | 53 | 65 | 58 |
|  | Water absorption [%] | 0.17 | 0.17 | 0.17 | 0.18 | 0.17 | 0.19 | 0.21 | 0.19 | 0.17 |
|  | Flame resistance (UL-94) | V-0 | V-0 | V-0 | V-0 | V-0 | V-0 | V-0 | V-0 | V-0 |
|  | Soldering resistance (n/10) | 0 | 0 | 0 | 0 | 0 | 1 | 0 | 1 | 0 |

|  |  | Example (Series I) | | | | | | | |
|---|---|---|---|---|---|---|---|---|---|
|  |  | 10 | 11 | 12 | 13 | 14 | 15 | 16 | 17 |
| (A) | Epoxy resin 1 (a) | 7.9 | 5.1 | 6.0 | 6.0 | 6.0 | 6.0 | 6.0 | 6.0 |
|  | Epoxy resin 2 (a'-1) |  |  |  |  |  |  |  |  |
| (B) | Phenol resin 1 | 8.9 | 5.7 | 6.8 | 6.8 | 6.8 | 6.8 | 6.7 | 6.8 |
|  | Phenol resin 2 |  |  |  |  |  |  |  |  |
|  | Phenol resin 3 |  |  |  |  |  |  |  |  |
| (C) | Fused spherical silica | 82.0 | 88.0 | 86.0 | 86.0 | 86.0 | 86.0 | 86.0 | 86.0 |
| (D) | Curing accelerator 1 | 0.2 | 0.2 | 0.2 | 0.2 | 0.2 |  |  |  |
|  | Curing accelerator 2 |  |  |  |  |  | 0.2 |  |  |
|  | Curing accelerator 3 |  |  |  |  |  |  | 0.3 |  |
|  | Curing accelerator 4 |  |  |  |  |  |  |  | 0.2 |
| (E) | Coupling agent 1 | 0.3 | 0.3 | 0.3 | 0.3 | 0.3 | 0.3 | 0.3 | 0.3 |
|  | Coupling agent 2 |  |  |  |  |  |  |  |  |
| (F) | 2,3-Dihydroxy naphthalene | 0.2 | 0.2 |  |  |  | 0.2 | 0.2 | 0.2 |
|  | 1,2-dihydroxy naphthalene |  |  | 0.2 |  |  |  |  |  |
|  | Catechol |  |  |  | 0.2 |  |  |  |  |
|  | Pyrogallol |  |  |  |  | 0.2 |  |  |  |
|  | Carnauba wax | 0.2 | 0.2 | 0.2 | 0.2 | 0.2 | 0.2 | 0.2 | 0.2 |
|  | Carbon black | 0.3 | 0.3 | 0.3 | 0.3 | 0.3 | 0.3 | 0.3 | 0.3 |

TABLE 1-continued

| | | | | | | | | | |
|---|---|---|---|---|---|---|---|---|---|
| Spiral flow | [cm] | 165 | 95 | 102 | 102 | 103 | 95 | 103 | 102 |
| Curing torque ratio | [%] | 53 | 59 | 56 | 56 | 55 | 55 | 67 | 63 |
| Water absorption | [%] | 0.26 | 0.15 | 0.17 | 0.17 | 0.17 | 0.17 | 0.17 | 0.17 |
| Flame resistance | (UL-94) | V-0 | V-0 | V-0 | V-0 | V-0 | V-0 | V-0 | V-0 |
| Soldering resistance | (n/10) | 0 | 0 | 0 | 0 | 0 | 0 | 0 | 0 |

TABLE 2

| | | Comparative example (Series I) | | |
|---|---|---|---|---|
| | | 1 | 2 | 3 |
| | Epoxy resin 3 | 9.3 | 8.0 | |
| | Epoxy resin 2 | | | 6.2 |
| (B) | Phenol resin 1 | | | 6.6 |
| | Phenol resin 2 | | 4.8 | |
| | Phenol resin 3 | 3.5 | | |
| (C) | Fused spherical silica | 86.0 | 86.0 | 86.0 |
| (D) | Curing accelerator 1 | 0.2 | 0.2 | 0.2 |
| (E) | Coupling agent 1 | 0.3 | 0.3 | 0.3 |
| (F) | 2,3-Dihydroxy naphthalene | 0.2 | 0.2 | 0.2 |
| | Carnauba wax | 0.2 | 0.2 | 0.2 |
| | Carbon black | 0.3 | 0.3 | 0.3 |
| | Spiral flow [cm] | 75 | 80 | 135 |
| | Curing torque ratio [%] | 60 | 57 | 52 |
| | Water absorption [%] | 0.24 | 0.18 | 0.22 |
| | Flame resistance (UL-94) | V-1 | V-1 | BO |
| | Soldering resistance (n/10) | 4 | 2 | 6 |

Example Series II

Example II-1

The following components were mixed at ordinary temperatures by a mixer, melted and kneaded by a heating roll at 80 to 100° C., cooled and ground to give an epoxy resin composition. The evaluation results are shown in Table 3.

| | |
|---|---|
| Epoxy resin 1: Epoxy resin (a) of the formula (11) (epoxy equivalent 180; melting point 105° C.; the ratio of the component having a structure of the formula (11) with n equal to 0(zero) was 85% based on the whole of the resin; hydrolyzable chlorine content, 100 ppm) | 8.1 parts by weight |
| Phenol resin 1: A compound represented by the formula (2) or (5) (softening point 80° C., hydroxyl group equivalent 105, represented by formula (2) wherein R1 is a hydroxy phenylene group, R2OH is phenol, R3 is a hydrogen atom, and R4 is a hydrogen atom, or formula (5) wherein R1 is a hydrogen atom) | 4.7 parts by weight |
| Fused spherical silica (average particle diameter 30 μm) | 86.0 parts by weight |
| Curing accelerator 1, triphenyl phosphine | 0.2 part by weight |
| Coupling agent 1, γ-glycidylpropyltrimethoxy silane | 0.6 part by weight |
| 2,3-Dihydroxy naphthalene | 0.05 part by weight |
| Carnauba wax | 0.2 part by weight |
| Carbon black | 0.3 part by weight |

[Evaluation]

The spiral flow, curing torque ratio, water absorption and flame resistance were evaluated in the same manner as in Example Series I. The Flexural modulus upon heating, package warpage and soldering resistance were evaluated in the following manner.

*Flexural modulus upon heating: Using a transfer molding machine, a test specimen of 80 mm in length, 10 mm in width and 4 mm in thickness was molded under the conditions of a mold temperature of 175° C., a transfer pressure of 9.8 MPa and a curing time of 120 seconds, then post-cured by heating at 175° C. for 8 hours and measured for Flexural modulus upon heating in accordance with JIS K 6911 (at 260° C). The unit is N/mm².

*Package warpage: Using a transfer molding machine, 225 p BGA (substrate thickness 0.36 mm, bismaleimide/triazine/glass cloth substrate; package with a size of 24×24 mm and thickness 1.17 mm; silicon chip with a size of 9×9 mm and thickness 0.35 mm; the chip was bonded via gold wires of 25 μm min diameter to a bonding pad of the circuit substrate) was molded at a mold temperature of 180° C., at a transfer pressure of 7.4 MPa and for a curing time of 2 minutes. The substrate with the chip was then post-cured by heat treatment at 175° C. for 8 hours. After cooling to room temperature, displacement in the direction of height was measured in the direction of a diagonal line relative to the gate of the package by using a surface roughness meter, and the maximum difference in displacement was expressed as warpage. The unit is μm.

*Soldering resistance: Using a transfer molding machine, 225 p BGA (substrate thickness 0.36 mm, bismaleimide/triazine/glass cloth substrate; package with a size 24×24 mm and thickness 1.17 mm; silicon chip with a size of 9×9 mm and thickness 0.35 mm; the chip was bonded via gold wires of 25 μm in diameter to a bonding pad of the circuit substrate) was molded at a mold temperature of 180° C., at a transfer pressure of 7.4 MPa and for a curing time of 2 minutes. 8 packages subjected to heat treatment at 175° C. for 8 hours as post-curing were subjected to humidification treatment at 85° C. under 60% relative humidity for 168 hours, and then subjected to IR reflow treatment (260° C. and conditions according to JEDEC Level 2). After the treatment, presence or absence of internal delamination and cracking was observed by a scanning acoustic tomograph to count the number of defective packages. When the number of defective packages is n, n/8 is indicated.

Examples II-2 to II-16

Comparative Examples II-1 to II-6

According to the formulations in Tables 3, 4 and 5, epoxy resin compositions were produced in the same manner as in Example II-1 and evaluated in the same manner as in Example II-1. The evaluation results are shown in Tables 3, 4 and 5.

Components used other than those in Example II-1 are shown below.

Epoxy resin 2: Biphenyl type epoxy resin; epoxy resin (a'-1) of the formula (6) (YX-4000 HK manufactured by Japan Epoxy Resins Co., Ltd., melting point 105° C., epoxy equivalent 191, represented by the formula (6) wherein R1 are a methyl group in 3,3',5, and 5'position, and a hydrogen atom in remaining position)

Epoxy resin 3: Triphenol methane type epoxy resin (E-1032H60 manufactured by Japan Epoxy Resins Co., Ltd., softening point 60.0° C., epoxy equivalent 171)

Phenol resin 2: Phenol aralkyl resin containing biphenylene structure, a compound represented by the formula (2) or (3) (MEH-7851SS manufactured by Meiwa Plastic Industries, Ltd., hydroxyl group equivalent 203, softening point 66° C., represented by formula (2) wherein R1 is a biphenylene group, R2OH is phenol, R3 is a hydrogen atom, and R4 is a hydrogen atom, or formula (3) wherein R1 is a biphenylene group and R2 is a hydrogen atom)

Phenol resin 3: Triphenol methane type phenol resin (MEH-7500 manufactured by Meiwa Plastic Industries, Ltd., softening point 110.0° C., hydroxyl group equivalent 97)

Curing accelerator 2: 1,8-Diazabicyclo(5.4.0)undecene-7 (abbreviated hereinafter as DBU)

Curing accelerator 3: A curing accelerator represented by formula (14):

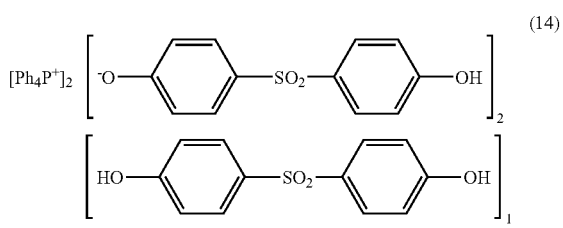

Curing accelerator 4: A curing accelerator represented by formula (15):

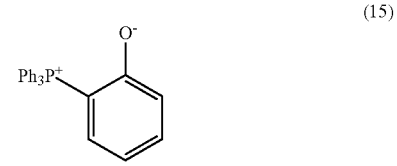

Coupling agent 2: γ-Mercaptopropyltrimethoxy silane 1,2-dihydroxy naphthalene catechol pyrogallol

TABLE 3

|  |  | Example (Series I) | | | | | | | |
|---|---|---|---|---|---|---|---|---|---|
|  |  | 1 | 2 | 3 | 4 | 5 | 6 | 7 | 8 |
| (A) | Epoxy resin 1 (a) | 8.1 | 8.1 | 8.0 | 7.7 | 8.2 | 4.1 | 7.3 | 8.1 |
|  | Epoxy resin 2 (a'-1) |  |  |  |  |  | 4.1 |  |  |
| (B) | Phenol resin 1 | 4.7 | 4.7 | 4.7 | 4.5 | 4.8 | 4.6 | 2.8 | 4.7 |
|  | Phenol resin 2 |  |  |  |  |  |  | 2.8 |  |
|  | Phenol resin 3 |  |  |  |  |  |  |  |  |
| (C) | Fused spherical silica | 86.0 | 86.0 | 86.0 | 86.0 | 86.0 | 86.0 | 86.0 | 86.0 |
| (D) | Curing accelerator 1 | 0.2 | 0.2 | 0.2 | 0.2 | 0.2 | 0.2 | 0.2 | 0.2 |
| (E) | Coupling agent 1 | 0.6 | 0.3 | 0.1 | 0.9 | 0.3 | 0.3 | 0.3 |  |
|  | Coupling agent 2 |  |  |  |  |  |  |  | 0.3 |
| (F) | 2,3-Dihydroxy naphthalene | 0.05 | 0.2 | 0.5 | 0.2 | 0.02 | 0.2 | 0.2 | 0.2 |
|  | Carnauba wax | 0.2 | 0.2 | 0.2 | 0.2 | 0.2 | 0.2 | 0.2 | 0.2 |
|  | Carbon black | 0.3 | 0.3 | 0.3 | 0.3 | 0.3 | 0.3 | 0.3 | 0.3 |
|  | Spiral flow [cm] | 100 | 98 | 93 | 102 | 95 | 106 | 105 | 100 |
|  | Curing torque ratio [%] | 63 | 65 | 66 | 61 | 66 | 62 | 58 | 64 |
|  | Water absorption [%] | 0.22 | 0.22 | 0.22 | 0.22 | 0.22 | 0.22 | 0.22 | 0.22 |
|  | Flame resistance (UL-94) | V-0 | V-0 | V-0 | V-0 | V-0 | V-1 | V-0 | V-0 |
|  | Flexural modulus upon heating [N/mm$^2$] | 1140 | 1160 | 1170 | 1170 | 1180 | 1120 | 800 | 1160 |
|  | Package warpage [μm] | 52 | 53 | 52 | 53 | 53 | 63 | 63 | 53 |
|  | Soldering resistance (n/8) | 0 | 0 | 0 | 0 | 0 | 0 | 0 | 0 |

TABLE 4

|  |  | Example (Series I) | | | | | | | |
|---|---|---|---|---|---|---|---|---|---|
|  |  | 9 | 10 | 11 | 12 | 13 | 14 | 15 | 16 |
| (A) | Epoxy resin 1 (a) | 10.6 | 6.8 | 8.1 | 8.1 | 8.1 | 8.1 | 8.0 | 8.1 |
| (B) | Phenol resin 1 | 6.2 | 4.0 | 4.7 | 4.7 | 4.7 | 4.7 | 4.7 | 4.7 |
| (C) | Fused spherical silica | 82.0 | 88.0 | 86.0 | 86.0 | 86.0 | 86.0 | 86.0 | 86.0 |
| (D) | Curing accelerator 1 | 0.2 | 0.2 | 0.2 | 0.2 | 0.2 |  |  |  |
|  | Curing accelerator 2 |  |  |  |  |  | 0.2 |  |  |
|  | Curing accelerator 3 |  |  |  |  |  |  | 0.3 |  |
|  | Curing accelerator 4 |  |  |  |  |  |  |  | 0.2 |

TABLE 4-continued

| | | Example (Series I) | | | | | | | |
|---|---|---|---|---|---|---|---|---|---|
| | | 9 | 10 | 11 | 12 | 13 | 14 | 15 | 16 |
| (E) | Coupling agent 1 | 0.3 | 0.3 | 0.3 | 0.3 | 0.3 | 0.3 | 0.3 | 0.3 |
| (F) | 2,3-Dihydroxy naphthalene | 0.2 | 0.2 | | | | 0.2 | 0.2 | 0.2 |
| | 1,2-dihydroxy naphthalene | | | 0.2 | | | | | |
| | Catechol | | | | 0.2 | | | | |
| | Pyrogallol | | | | | 0.2 | | | |
| | Carnauba wax | 0.2 | 0.2 | 0.2 | 0.2 | 0.2 | 0.2 | 0.2 | 0.2 |
| | Carbon black | 0.3 | 0.3 | 0.3 | 0.3 | 0.3 | 0.3 | 0.3 | 0.3 |
| | Spiral flow [cm] | 158 | 78 | 100 | 100 | 101 | 93 | 110 | 98 |
| | Curing torque ratio [%] | 54 | 70 | 65 | 64 | 64 | 67 | 63 | 65 |
| | Water absorption [%] | 0.26 | 0.18 | 0.22 | 0.22 | 0.22 | 0.21 | 0.22 | 0.22 |
| | Flame resistance (UL-94) | V-0 | V-0 | V-0 | V-0 | V-0 | V-0 | V-0 | V-0 |
| | Flexural modulus upon heating [N/mm$^2$] | 1040 | 1480 | 1160 | 1150 | 1160 | 1170 | 1170 | 1100 |
| | Package warpage [μm] | 65 | 44 | 54 | 53 | 53 | 53 | 55 | 54 |
| | Soldering resistance (n/8) | 0 | 0 | 0 | 0 | 0 | 0 | 0 | 0 |

TABLE 5

| | | Comparative example (Series II) | | | |
|---|---|---|---|---|---|
| | | 1 | 2 | 3 | 4 |
| | Epoxy resin 2 (a'-1) | | | 8.5 | 8.3 |
| | Epoxy resin 3 | 8.2 | 7.9 | | |
| (B) | Phenol resin 1 | | 4.9 | | 4.5 |
| | Phenol resin 3 | 4.6 | | 4.3 | |
| (C) | Fused spherical silica | 86.0 | 86.0 | 86.0 | 86.0 |
| (D) | Curing accelerator 1 | 0.2 | 0.2 | 0.2 | 0.2 |
| (E) | Coupling agent 1 | 0.3 | 0.3 | 0.3 | 0.3 |
| (F) | 2,3-Dihydroxy naphthalene | 0.2 | 0.2 | 0.2 | 0.2 |
| | Carnauba wax | 0.2 | 0.2 | 0.2 | 0.2 |
| | Carbon black | 0.3 | 0.3 | 0.3 | 0.3 |
| | Spiral flow [cm] | 80 | 85 | 98 | 105 |
| | Curing torque ratio [%] | 75 | 72 | 65 | 61 |
| | Water absorption [%] | 0.28 | 0.26 | 0.25 | 0.24 |
| | Flame resistance (UL-94) | BO | BO | BO | BO |
| | Flexural modulus upon heating [N/mm$^2$] | 5000 | 4500 | 1800 | 1600 |
| | Package warpage [μm] | 38 | 45 | 92 | 98 |
| | Soldering resistance (n/8) | 8 | 8 | 6 | 6 |

Example Series III

The phenol resins A to E used in the Examples and Comparative Examples are phenol resins represented by formula (5), and the properties thereof are shown in Table 6.

TABLE 6

$$\text{H}-\underset{R1}{\underset{|}{\bigcirc}}-\underset{H_2}{C}-\left(-\underset{R1}{\underset{|}{\bigcirc}}-\underset{H_2}{C}-\right)_n-\underset{R1}{\underset{|}{\bigcirc}}-\text{H}$$

(with OH groups on each aromatic ring)

| | Phenol resin | | | | |
|---|---|---|---|---|---|
| | A | B | C | D | E |
| Weight average molecular weight | 500 | 600 | 350 | 650 | 1500 |
| Mw/Mn | 1.2 | 1.3 | 1.3 | 2.2 | 3.6 |
| Softening point [° C.] | 65 | 68 | 58 | 68 | 90.0 |
| Hydroxyl group equivalent [g/eg] | 104 | 104 | 104 | 104 | 105 |

Example III-1

The following components were mixed at ordinary temperatures by a mixer, melted and kneaded by a heating roll at 80 to 100° C., cooled and ground to give an epoxy resin composition. The evaluation results are shown in Table 7.

| | |
|---|---|
| Epoxy resin 1: Epoxy resin (a) of the formula (11) (epoxy equivalent 180; melting point 105° C.; the ratio of the component having a structure of the formula (11) with n equal to 0(zero) was 85% based on the whole of the resin; hydrolyzable chlorine content, 100 ppm) | 8.1 parts by weight |
| Phenol resin A | 4.7 parts by weight |
| Fused spherical silica (average particle diameter 30 μm) | 86.0 parts by weight |
| Curing accelerator 1, triphenyl phosphine | 0.2 part by weight |
| Coupling agent 1, γ-glycidylpropyltrimethoxy silane | 0.6 part by weight |
| 2,3-Dihydroxy naphthalene | 0.05 part by weight |
| Carnauba wax | 0.2 part by weight |
| Carbon black | 0.3 part by weight |

31

[Evaluation]

The spiral flow, curing torque ratio, water absorption and flame resistance were evaluated in the same manner as in Example Series I. The Flexural modulus upon heating, package warpage and soldering resistance were evaluated in the same manner as in Example Series II.

Examples III-2 to III-17

Comparative Examples III-1 to III-12

According to the formulations in Tables 7, 8 and 9, epoxy resin compositions were produced in the same manner as in Example III-1 and evaluated in the same manner as in Example III-1. The evaluation results are shown in Tables 7, 8 and 9.

Components used other than those in Example III-1 are shown below.

Epoxy resin 2: Biphenyl type epoxy resin; epoxy resin (a'-1) of the formula (6) (YX-4000 HK manufactured by Japan Epoxy Resins Co., Ltd., melting point 105° C., epoxy equivalent 191, represented by the formula (6) wherein R1 are a methyl group in 3,3',5, and 5'position, and a hydrogen atom in remaining position)

Epoxy resin 3: Triphenol methane type epoxy resin (E-1032H60 manufactured by Japan Epoxy Resins Co., Ltd., softening point 60.0° C., epoxy equivalent 171)

Phenol resin 1: Phenol aralkyl resin containing biphenylene structure, a compound represented by the formula (2) or (3) (MEH-7851SS manufactured by Meiwa Plastic Industries, Ltd., hydroxyl group equivalent 203, softening point 66° C., represented by formula (2) wherein R1 is a biphenylene group, R2OH is phenol, R3 is a hydrogen atom, and R4 is a hydrogen atom, or formula (3) wherein R1 is a biphenylene group and R2 is a hydrogen atom)

32

Phenol resin 2: Triphenol methane type phenol resin (MEH-7500 manufactured by Meiwa Plastic Industries, Ltd., softening point 110.0° C., hydroxyl group equivalent 97)

Curing accelerator 2: 1,8-Diazabicyclo(5.4.0)undecene-7 (abbreviated hereinafter as DBU)

Curing accelerator 3: A curing accelerator represented by formula (14):

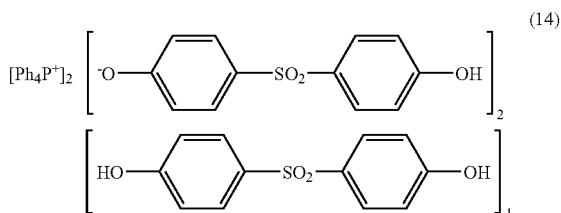

Curing accelerator 4: A curing accelerator represented by formula (15):

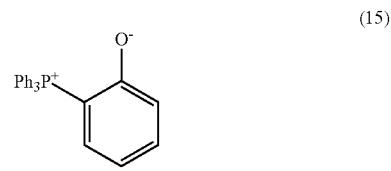

Coupling agent 2: γ-Mercaptopropyltrimethoxy silane 1,2-dihydroxy naphthalene
catechol
pyrogallol

TABLE 7

| | | Example (Series III) | | | | | | | | |
|---|---|---|---|---|---|---|---|---|---|---|
| | | 1 | 2 | 3 | 4 | 5 | 6 | 7 | 8 | 9 |
| (A) | Epoxy resin 1 (a) | 8.1 | 8.1 | 8.0 | 7.7 | 8.2 | 8.1 | 4.1 | 7.3 | 8.1 |
| | Epoxy resin 2 (a'-1) | | | | | | | 4.1 | | |
| (B) | Phenol resin A | 4.7 | 4.7 | 4.7 | 4.5 | 4.8 | | 4.6 | 2.8 | 4.7 |
| | Phenol resin B | | | | | | 4.7 | | | |
| | Phenol resin 1 | | | | | | | | 2.8 | |
| (C) | Fused spherical silica | 86.0 | 86.0 | 86.0 | 86.0 | 86.0 | 86.0 | 86.0 | 86.0 | 86.0 |
| (D) | Curing accelerator 1 | 0.2 | 0.2 | 0.2 | 0.2 | 0.2 | 0.2 | 0.2 | 0.2 | 0.2 |
| (E) | Coupling agent 1 | 0.6 | 0.3 | 0.1 | 0.9 | 0.3 | 0.3 | 0.3 | 0.3 | |
| | Coupling agent 2 | | | | | | | | | 0.3 |
| (F) | 2,3-Dihydroxy naphthalene | 0.05 | 0.2 | 0.5 | 0.2 | 0.02 | 0.2 | 0.2 | 0.2 | 0.2 |
| | Carnauba wax | 0.2 | 0.2 | 0.2 | 0.2 | 0.2 | 0.2 | 0.2 | 0.2 | 0.2 |
| | Carbon black | 0.3 | 0.3 | 0.3 | 0.3 | 0.3 | 0.3 | 0.3 | 0.3 | 0.3 |
| | Spiral flow [cm] | 120 | 116 | 113 | 124 | 112 | 110 | 135 | 112 | 121 |
| | Curing torque ratio [%] | 58 | 59 | 57 | 57 | 58 | 60 | 55 | 56 | 58 |
| | Water absorption [%] | 0.23 | 0.22 | 0.22 | 0.22 | 0.22 | 0.23 | 0.24 | 0.20 | 0.23 |
| | Flame resistance (UL-94) | V-0 | V-0 | V-0 | V-0 | V-0 | V-0 | V-1 | V-0 | V-0 |
| | Flexural modulus upon heating [N/mm$^2$] | 1090 | 1110 | 1120 | 1120 | 1130 | 1150 | 1070 | 750 | 1110 |
| | Package warpage [μm] | 55 | 53 | 55 | 55 | 52 | 51 | 66 | 65 | 55 |
| | Soldering resistance (n/8) | 0 | 0 | 0 | 0 | 0 | 0 | 2 | 0 | 0 |

TABLE 8

| | | Example (Series III) | | | | | | | |
|---|---|---|---|---|---|---|---|---|---|
| | | 10 | 11 | 12 | 13 | 14 | 15 | 16 | 17 |
| (A) | Epoxy resin 1 (a) | 10.6 | 6.8 | 8.1 | 8.1 | 8.1 | 8.1 | 8.0 | 8.1 |
| (B) | Phenol resin A | 6.2 | 4.0 | 4.7 | 4.7 | 4.7 | 4.7 | 4.7 | 4.7 |

TABLE 8-continued

|   |   | Example (Series III) | | | | | | | |
|---|---|---|---|---|---|---|---|---|---|
|   |   | 10 | 11 | 12 | 13 | 14 | 15 | 16 | 17 |
| (C) | Fused spherical silica | 82.0 | 88.0 | 86.0 | 86.0 | 86.0 | 86.0 | 86.0 | 86.0 |
| (D) | Curing accelerator 1 | 0.2 | 0.2 | 0.2 | 0.2 | 0.2 |   |   |   |
|   | Curing accelerator 2 |   |   |   |   |   | 0.2 |   |   |
|   | Curing accelerator 3 |   |   |   |   |   |   | 0.3 |   |
|   | Curing accelerator 4 |   |   |   |   |   |   |   | 0.2 |
| (E) | Coupling agent 1 | 0.3 | 0.3 | 0.3 | 0.3 | 0.3 | 0.3 | 0.3 | 0.3 |
| (F) | 2,3-Dihydroxy naphthalene | 0.2 | 0.2 |   |   |   | 0.2 | 0.2 | 0.2 |
|   | 1,2-dihydroxy naphthalene |   |   | 0.2 |   |   |   |   |   |
|   | Catechol |   |   |   | 0.2 |   |   |   |   |
|   | Pyrogallol |   |   |   |   | 0.2 |   |   |   |
|   | Carnauba wax | 0.2 | 0.2 | 0.2 | 0.2 | 0.2 | 0.2 | 0.2 | 0.2 |
|   | Carbon black | 0.3 | 0.3 | 0.3 | 0.3 | 0.3 | 0.3 | 0.3 | 0.3 |
|   | Spiral flow [cm] | 178 | 99 | 121 | 120 | 121 | 113 | 122 | 118 |
|   | Curing torque ratio [%] | 49 | 65 | 59 | 59 | 58 | 58 | 58 | 58 |
|   | Water absorption [%] | 0.26 | 0.18 | 0.22 | 0.22 | 0.22 | 0.22 | 0.22 | 0.22 |
|   | Flame resistance (UL-94) | V-0 | V-0 | V-0 | V-0 | V-0 | V-0 | V-0 | V-0 |
|   | Flexural modulus upon heating [N/mm$^2$] | 990 | 1430 | 1110 | 1100 | 1110 | 1120 | 1120 | 1050 |
|   | Package warpage [μm] | 68 | 46 | 56 | 56 | 55 | 55 | 57 | 55 |
|   | Soldering resistance (n/8) | 0 | 0 | 0 | 0 | 0 | 0 | 0 | 0 |

TABLE 9

|   |   | Comparative example (Series III) | | | | | | | |
|---|---|---|---|---|---|---|---|---|---|
|   |   | 1 | 2 | 3 | 4 | 5 | 6 | 7 | 8 |
|   | Epoxy resin 2 (a'-1) |   |   |   |   | 8.5 | 8.3 | 8.3 | 8.3 |
|   | Epoxy resin 3 | 8.2 | 7.9 | 7.9 | 7.9 |   |   |   |   |
| (B) | Phenol resin C |   | 4.9 |   |   |   | 4.5 |   |   |
|   | Phenol resin D |   |   | 4.9 |   |   |   | 4.5 |   |
|   | Phenol resin E |   |   |   | 4.9 |   |   |   | 4.5 |
|   | Phenol resin 2 | 4.6 |   |   |   | 4.3 |   |   |   |
| (C) | Fused spherical silica | 86.0 | 86.0 | 86.0 | 86.0 | 86.0 | 86.0 | 86.0 | 86.0 |
| (D) | Curing accelerator 1 | 0.2 | 0.2 | 0.2 | 0.2 | 0.2 | 0.2 | 0.2 | 0.2 |
| (E) | Coupling agent 1 | 0.3 | 0.3 | 0.3 | 0.3 | 0.3 | 0.3 | 0.3 | 0.3 |
| (F) | 2,3-Dihydroxy naphthalene | 0.2 | 0.2 | 0.2 | 0.2 | 0.2 | 0.2 | 0.2 | 0.2 |
|   | Carnauba wax | 0.2 | 0.2 | 0.2 | 0.2 | 0.2 | 0.2 | 0.2 | 0.2 |
|   | Carbon black | 0.3 | 0.3 | 0.3 | 0.3 | 0.3 | 0.3 | 0.3 | 0.3 |
|   | Spiral flow [cm] | 80 | 118 | 95 | 81 | 98 | 155 | 135 | 99 |
|   | Curing torque ratio [%] | 75 | 58 | 60 | 74 | 65 | 48 | 51 | 68 |
|   | Water absorption [%] | 0.28 | 0.27 | 0.28 | 0.28 | 0.25 | 0.24 | 0.25 | 0.25 |
|   | Flame resistance (UL-94) | BO | BO | BO | BO | BO | BO | BO | BO |
|   | Flexural modulus upon heating [N/mm$^2$] | 5000 | 3700 | 4000 | 4800 | 1800 | 1500 | 1700 | 2300 |
|   | Package warpage [μm] | 38 | 68 | 65 | 42 | 92 | 102 | 92 | 93 |
|   | Soldering resistance (n/8) | 8 | 6 | 6 | 7 | 6 | 6 | 6 | 7 |

Example Series IV

Example IV-1

The following components were mixed at ordinary temperatures by a mixer, melted and kneaded by a heating roll at 80 to 100° C., cooled and ground to give an epoxy resin composition. The evaluation results are shown in Table 10.

| Epoxy resin 1: Epoxy resin (a) of the formula (11) (epoxy equivalent 180; melting point 105° C.; the ratio of the component having a structure of the formula (11) with n equal to 0 (zero) was 85% based on the whole of the resin; hydrolyzable chlorine content, 100 ppm) | 5.8 parts by weight |
|---|---|
| Phenol resin 1: Naphthol aralkyl resin containing phenylene structure; Phenol resin represented by the formula (16) (softening point 85° C. and hydroxyl group equivalent 210) | 6.8 parts by weight |

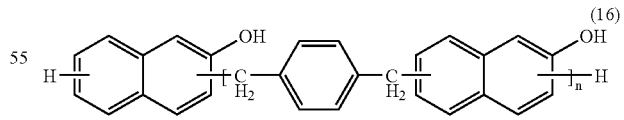

(16)

| Fused spherical silica (average particle diameter 30 μm) | 86.0 parts by weight |
|---|---|
| Curing accelerator 1, triphenyl phosphine | 0.2 part by weight |
| Coupling agent 1, γ-glycidylpropyltrimethoxy silane | 0.6 part by weight |
| 2,3-Dihydroxy naphthalene | 0.05 part by weight |
| Carnauba wax | 0.2 part by weight |
| Carbon black | 0.3 part by weight |

[Evaluation]

The spiral flow, curing torque ratio, water absorption and flame resistance were evaluated in the same manner as in Example Series I. The Flexural modulus upon heating, package warpage and soldering resistance were evaluated in the same manner as in Example Series II.

Examples IV-2 to IV-16

Comparative Examples IV-1 to IV-6>

According to the formulations in Tables 10, 11 and 12, epoxy resin compositions were produced in the same manner as in Example IV-1 and evaluated in the same manner as in Example IV-1. The evaluation results are shown in Tables 10, 11 and 12.

Components used other than those in Example IV-1 are shown below.

Epoxy resin 2: Biphenyl type epoxy resin; epoxy resin of the formula (6) (YX-4000 HK manufactured by Japan Epoxy Resins Co., Ltd., melting point 105° C., epoxy equivalent 191, represented by the formula (6) wherein R1 are a methyl group in 3,3',5, and 5'position, and a hydrogen atom in remaining position)

Epoxy resin 3: Triphenol methane type epoxy resin (E-1032H60 manufactured by Japan Epoxy Resins Co., Ltd., softening point 60.0° C., epoxy equivalent 171)

Phenol resin 2: Phenol aralkyl resin containing biphenylene structure, a compound represented by the formula (2) or (3) (MEH-7851SS manufactured by Meiwa Plastic Industries, Ltd., hydroxyl group equivalent 203, softening point 66° C., represented by formula (2) wherein R1 is a biphenylene group, R2OH is phenol, R3 is a hydrogen atom, and R4 is a hydrogen atom, or formula (3) wherein R1 is a biphenylene group and R2 is a hydrogen atom)

Phenol resin 3: Triphenol methane type phenol resin (MEH-7500 manufactured by Meiwa Plastic Industries, Ltd., softening point 110.0° C., hydroxyl group equivalent 97)

Curing accelerator 2: 1,8-Diazabicyclo(5.4.0)undecene-7 (abbreviated hereinafter as DBU)

Curing accelerator 3: A curing accelerator represented by formula (14):

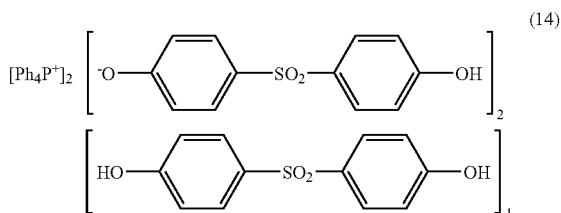

Curing accelerator 4: A curing accelerator represented by formula (15):

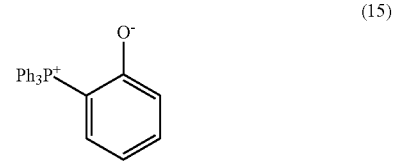

Coupling agent 2: γ-Mercaptopropyltrimethoxy silane 1,2-dihydroxy naphthalene
catechol
pyrogallol

TABLE 10

| | | Example (Series IV) | | | | | | | |
|---|---|---|---|---|---|---|---|---|---|
| | | 1 | 2 | 3 | 4 | 5 | 6 | 7 | 8 |
| (A) | Epoxy resin 1 (a) | 5.8 | 5.9 | 5.9 | 5.6 | 6.0 | 3.0 | 6.0 | 5.9 |
| | Epoxy resin 2 (a'-1) | | | | | | 3.0 | | |
| (B) | Phenol resin 1 | 6.8 | 6.9 | 6.8 | 6.6 | 7.0 | 6.8 | 3.4 | 6.9 |
| | Phenol resin 2 | | | | | | | 3.4 | |
| (C) | Fused spherical silica | 86.0 | 86.0 | 86.0 | 86.0 | 86.0 | 86.0 | 86.0 | 86.0 |
| (D) | Curing accelerator 1 | 0.2 | 0.2 | 0.2 | 0.2 | 0.2 | 0.2 | 0.2 | 0.2 |
| (E) | Coupling agent 1 | 0.6 | 0.3 | 0.1 | 0.9 | 0.3 | 0.3 | 0.3 | |
| | Coupling agent 2 | | | | | | | | 0.3 |
| (F) | 2,3-Dihydroxy naphthalene | 0.05 | 0.2 | 0.5 | 0.2 | 0.02 | 0.2 | 0.2 | 0.2 |
| | Carnauba wax | 0.2 | 0.2 | 0.2 | 0.2 | 0.2 | 0.2 | 0.2 | 0.2 |
| | Carbon black | 0.3 | 0.3 | 0.3 | 0.3 | 0.3 | 0.3 | 0.3 | 0.3 |
| | Spiral flow [cm] | 93 | 88 | 85 | 96 | 83 | 96 | 94 | 92 |
| | Curing torque ratio [%] | 52 | 55 | 56 | 51 | 57 | 50 | 50 | 54 |
| | Water absorption [%] | 0.16 | 0.16 | 0.16 | 0.16 | 0.16 | 0.16 | 0.15 | 0.16 |
| | Flame resistance (UL-94) | V-0 | V-0 | V-0 | V-0 | V-0 | V-1 | V-0 | V-0 |
| | Flexural modulus upon heating [N/mm$^2$] | 720 | 720 | 740 | 750 | 760 | 650 | 600 | 730 |
| | Package warpage [μm] | 39 | 38 | 37 | 43 | 38 | 42 | 43 | 38 |
| | Soldering resistance (n/8) | 0 | 0 | 0 | 0 | 0 | 1 | 0 | 0 |

TABLE 11

| | | Example (Series IV) | | | | | | | |
|---|---|---|---|---|---|---|---|---|---|
| | | 9 | 10 | 11 | 12 | 13 | 14 | 15 | 16 |
| (A) | Epoxy resin 1 (a) | 7.8 | 5.0 | 5.9 | 5.9 | 5.9 | 5.9 | 5.9 | 5.9 |
| (B) | Phenol resin 1 | 9.0 | 5.8 | 6.9 | 6.9 | 6.9 | 6.9 | 6.8 | 6.9 |
| (C) | Fused spherical silica | 82.0 | 88.0 | 86.0 | 86.0 | 86.0 | 86.0 | 86.0 | 86.0 |

TABLE 11-continued

|  |  | Example (Series IV) | | | | | | | |
|---|---|---|---|---|---|---|---|---|---|
|  |  | 9 | 10 | 11 | 12 | 13 | 14 | 15 | 16 |
| (D) | Curing accelerator 1 | 0.2 | 0.2 | 02 | 0.2 | 0.2 | | | |
|  | Curing accelerator 2 | | | | | | 0.2 | | |
|  | Curing accelerator 3 | | | | | | | 0.3 | |
|  | Curing accelerator 4 | | | | | | | | 0.2 |
| (E) | Coupling agent 1 | 0.3 | 0.3 | 0.3 | 0.3 | 0.3 | 0.3 | 0.3 | 0.3 |
| (F) | 2,3-Dihydroxy naphthalene | 0.2 | 0.2 | | | | 0.2 | 0.2 | 0.2 |
|  | 1,2-dihydroxy naphthalene | | | 0.2 | | | | | |
|  | Catechol | | | | 0.2 | | | | |
|  | Pyrogallol | | | | | 0.2 | | | |
|  | Carnauba wax | 0.2 | 0.2 | 0.2 | 0.2 | 0.2 | 0.2 | 0.2 | 0.2 |
|  | Carbon black | 0.3 | 0.3 | 0.3 | 0.3 | 0.3 | 0.3 | 0.3 | 0.3 |
|  | Spiral flow [cm] | 148 | 74 | 90 | 90 | 91 | 84 | 100 | 88 |
|  | Curing torque ratio [%] | 49 | 60 | 55 | 54 | 55 | 56 | 53 | 55 |
|  | Water absorption [%] | 0.2 | 0.13 | 0.16 | 0.16 | 0.16 | 0.15 | 0.16 | 0.16 |
|  | Flame resistance (UL-94) | V-0 | V-0 | V-0 | V-0 | V-0 | V-0 | V-0 | V-0 |
|  | Flexural modulus upon heating [N/mm$^2$] | 620 | 980 | 710 | 720 | 720 | 730 | 740 | 700 |
|  | Package warpage [μm] | 50 | 30 | 39 | 39 | 38 | 38 | 40 | 39 |
|  | Soldering resistance (n/8) | 0 | 0 | 0 | 0 | 0 | 0 | 0 | 0 |

TABLE 12

|  |  | Comparative example (Series IV) | | | |
|---|---|---|---|---|---|
|  |  | 1 | 2 | 3 | 4 |
|  | Epoxy resin 2 (a'-1) | | | 8.5 | 6.1 |
|  | Epoxy resin 3 | 8.2 | 5.8 | | |
| (B) | Phenol resin 1 | | 7.1 | | 6.7 |
|  | Phenol resin 3 | 4.6 | | 4.3 | |
| (C) | Fused spherical silica | 86.0 | 86.0 | 86.0 | 86.0 |
| (D) | Curing accelerator 1 | 0.2 | 0.2 | 0.2 | 0.2 |
| (E) | Coupling agent 1 | 0.3 | 0.3 | 0.3 | 0.3 |
| (F) | 2,3-Dihydroxy naphthalene | 0.2 | 0.2 | 0.2 | 0.2 |
|  | Carnauba wax | 0.2 | 0.2 | 0.2 | 0.2 |
|  | Carbon black | 0.3 | 0.3 | 0.3 | 0.3 |
|  | Spiral flow [cm] | 80 | 82 | 98 | 115 |
|  | Curing torque ratio [%] | 75 | 68 | 65 | 62 |
|  | Water absorption [%] | 0.28 | 0.24 | 0.25 | 0.23 |
|  | Flame resistance (UL-94) | BO | BO | BO | BO |
|  | Flexural modulus upon heating [N/mm$^2$] | 5000 | 3500 | 1800 | 1400 |
|  | Package warpage [μm] | 38 | 45 | 92 | 98 |
|  | Soldering resistance (n/8) | 8 | 8 | 6 | 6 |

Example Series V

Evaluation of Encapsulating Material for Lead Frame

Tables 13 to 15

Example V-1

The following components were mixed at ordinary temperatures by a mixer, melted and kneaded by a heating roll at 80 to 100° C., cooled and ground to give an epoxy resin composition. The evaluation results are shown in Table 13.

| | |
|---|---|
| Epoxy resin 1: Epoxy resin (a) of the formula (11) (epoxy equivalent 180; melting point 105° C.; the ratio of the component having a structure of the formula (11) with n equal to 0(zero) was 85% based on the whole of the resin; hydrolyzable chlorine content, 100 ppm) | 1.8 parts by weight |
| Epoxy resin 2: Biphenyl type epoxy resin; epoxy resin (a'-1) of the formula (6) (YX4000 HK manufactured by Japan Epoxy Resins Co., Ltd., epoxy equivalent 191, melting point 105° C., represented by the formula (6) wherein R1 are a methyl group in 3, 3', 5, and 5'position, and a hydrogen atom in remaining position) | 4.3 parts by weight |
| Phenol resin 1: Phenol aralkyl resin containing biphenylene structure, a compound represented by the formula (2) or (3) (MEH-7851SS manufactured by Meiwa Plastic Industries, Ltd., hydroxyl group equivalent 203, softening point 66° C., represented by formula (2) wherein R1 is a biphenylene group, R2OH is phenol, R3 is a hydrogen atom, and R4 is a hydrogen atom, or formula (3) wherein R1 is a biphenylene group and R2 is a hydrogen atom) | 6.7 parts by weight |

-continued

| | |
|---|---|
| Fused spherical silica (average particle diameter 30 µm) | 86.0 parts by weight |
| Curing accelerator 1, triphenyl phosphine | 0.2 part by weight |
| Coupling agent 1, γ-glycidylpropyltrimethoxy silane | 0.3 part by weight |
| 2,3-Dihydroxy naphthalene | 0.2 part by weight |
| Carnauba wax | 0.2 part by weight |
| Carbon black | 0.3 part by weight |

[Evaluation]

The spiral flow, curing torque ratio, water absorption and flame resistance were evaluated in the same manner as in Example Series I. Soldering resistance 1 was evaluated in the same manner as for soldering resistance in Example Series I. Gold wire displacement 1 was evaluated in the following manner.

Figure 3:
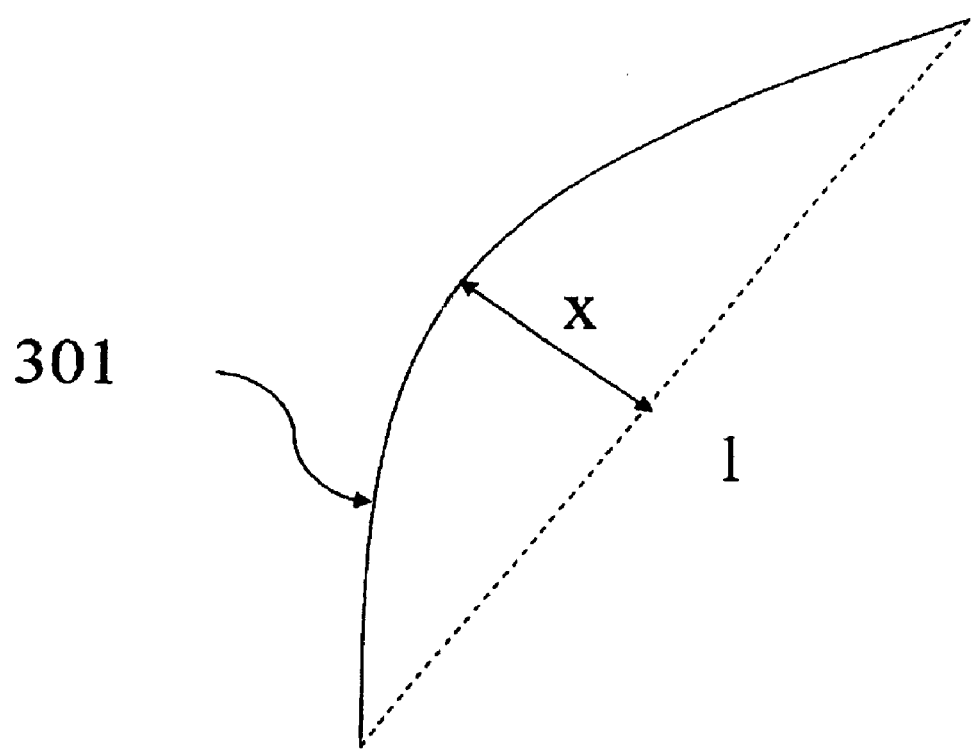
FIG. 3 is a view illustrating displacement of gold wire according to the present invention.

*Gold wire displacement 1: Using a low-pressure transfer molding machine, a package obtained by molding 208 pQFP with a body size 28×28×3.2 mm (frame wherein an Si chip of 10×10×0.35 mm was bonded to a Cu frame and bonded via a gold wire; the average length of the gold wire is 4 mm) at a mold temperature of 175° C. for a transfer time of 10 seconds for a curing time of 90 seconds at a transfer pressure of 9.8 MPa was observed by a soft X-ray fluoroscope, and the displacement of the gold wire 301 was expressed in the ratio of (maximum vertical displacement of the gold wire (X))/(the gold wire length (1))×100, as illustrated in FIG. 3. The unit is %.

Examples V-2 to V-20

Comparative Examples V-1 to V-3>

According to the formulations in Tables 13, 14 and 15, epoxy resin compositions were produced in the same manner as in Example V-1 and evaluated in the same manner as in Example V-1. The evaluation results are shown in Tables 13, 14 and 15.

Components used other than those in Example V-1 are shown below.

Epoxy resin 3: Epoxy resin (a'-2) of the formula (7) (YL6810 manufactured by Japan Epoxy Resins Co., Ltd., epoxy equivalent 172, melting point 45° C., represented by the formula (7) wherein R1 is a methyl group; the ratio of the component having a structure of formula (7) with n equal to 0 (zero) was 99% or more based on the whole of the resin)

Epoxy resin 4: Phenol aralkyl type epoxy resin containing biphenylene structure (NC-3000 manufactured by Nippon Kayaku Co., Ltd., softening point 56.5° C., epoxy equivalent 274)

Phenol resin 3: A compound represented by the formula (2) or (3) (XLC-4L manufactured by Mitsui Chemicals, Inc., softening point 65° C., hydroxyl group equivalent 165, represented by formula (2) wherein R1 is a phenylene group, R2OH is phenol, R3 is a hydrogen atom, and R4 is a hydrogen atom, or formula (3) wherein R1 is a phenylene group and R2 is a hydrogen atom)

Phenol resin 4: Phenol novolak type phenol resin, a compound represented by the formula (2) or (5) (PR-HF-3 manufactured by Sumitomo Bakelite Co., Ltd., softening point 80° C., hydroxyl group equivalent 105, represented by formula (2) wherein R1 is a hydroxy phenylene group, R2OH is phenol, R3 is a hydrogen atom, and R4 is a hydrogen atom, or formula (5) wherein R1 is a hydrogen atom)

Curing accelerator 2: 1,8-Diazabicyclo(5.4.0)undecene-7

Curing accelerator 3: A curing accelerator represented by formula (14):

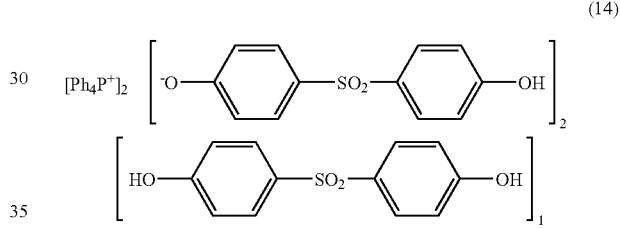

(14)

Curing accelerator 4: A curing accelerator represented by formula (15):

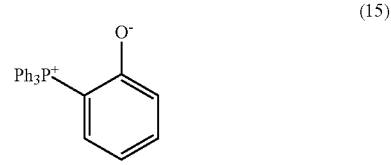

(15)

Coupling agent 2: γ-Mercaptopropyltrimethoxy silane 1,2-dihydroxy naphthalene
catechol
pyrogallol

TABLE 13

| | | Example (Series V) | | | | | | | |
|---|---|---|---|---|---|---|---|---|---|
| | | 1 | 2 | 3 | 4 | 5 | 6 | 7 | 8 |
| (A) | Epoxy resin 1 (a) | 1.8 | 4.2 | 3.0 | 3.0 | 3.0 | 2.9 | 3.1 | 2.9 |
| | Epoxy resin 2 (a'-1) | 4.3 | 1.8 | 3.0 | 3.0 | 3.0 | 2.9 | 3.1 | |
| | Epoxy resin 3 (a'-2) | | | | | | | | 2.9 |
| (B) | Phenol resin 1 | 6.7 | 6.9 | 6.7 | 6.8 | 6.7 | 6.5 | 6.9 | 6.9 |
| (C) | Fused spherical silica | 86.0 | 86.0 | 86.0 | 86.0 | 86.0 | 86.0 | 86.0 | 86.0 |
| (D) | Curing accelerator 1 | 0.2 | 0.2 | 0.2 | 0.2 | 0.2 | 0.2 | 0.2 | 0.2 |
| (E) | Coupling agent 1 | 0.3 | 0.3 | 0.6 | 0.3 | 0.1 | 0.9 | 0.3 | 0.3 |
| (F) | 2,3-Dihydroxy naphthalene | 0.2 | 0.2 | 0.1 | 0.2 | 0.5 | 0.2 | 0.0 | 0.2 |
| | Carnauba wax | 0.2 | 0.2 | 0.2 | 0.2 | 0.2 | 0.2 | 0.2 | 0.2 |
| | Carbon black | 0.3 | 0.3 | 0.3 | 0.3 | 0.3 | 0.3 | 0.3 | 0.3 |

TABLE 13-continued

|  | Example (Series V) | | | | | | | |
|---|---|---|---|---|---|---|---|---|
|  | 1 | 2 | 3 | 4 | 5 | 6 | 7 | 8 |
| Spiral flow [cm] | 135 | 100 | 128 | 120 | 110 | 130 | 115 | 131 |
| Curing torque ratio [%] | 42 | 52 | 45 | 48 | 50 | 44 | 50 | 43 |
| Water absorption [%] | 0.19 | 0.18 | 0.18 | 0.18 | 0.18 | 0.18 | 0.18 | 0.19 |
| Flame resistance (UL-94) | V-0 | V-0 | V-0 | V-0 | V-0 | V-0 | V-0 | V-0 |
| Gold wire displacement 1 [%] | 1.8 | 2.1 | 1.9 | 1.9 | 2.0 | 1.8 | 1.9 | 1.8 |
| Soldering resistance 1 (n/10) | 1 | 0 | 0 | 0 | 0 | 0 | 0 | 1 |

TABLE 14

|  |  | Example (Series V) | | | | | | | |
|---|---|---|---|---|---|---|---|---|---|
|  |  | 9 | 10 | 11 | 12 | 13 | 14 | 15 | 16 |
| (A) | Epoxy resin 1 | 3.3 | 2.1 | 3.6 | 3.0 | 3.9 | 2.5 | 3.0 | 3.0 |
|  | Epoxy resin 2 | 3.3 | 2.1 | 3.6 | 3.0 | 3.9 | 2.5 | 3.0 | 3.0 |
|  | Epoxy resin 4 |  | 2.1 |  |  |  |  |  |  |
| (B) | Phenol resin 1 |  | 6.4 | 2.8 | 6.8 | 8.9 | 5.7 | 6.8 | 6.8 |
|  | Phenol resin 3 | 6.1 |  |  |  |  |  |  |  |
|  | Phenol resin 4 |  |  | 2.8 |  |  |  |  |  |
| (C) | Fused spherical silica | 86.0 | 86.0 | 86.0 | 86.0 | 82.0 | 88.0 | 86.0 | 86.0 |
| (D) | Curing accelerator 1 | 0.2 | 0.2 | 0.2 | 0.2 | 0.2 | 0.2 | 0.2 | 0.2 |
| (E) | Coupling agent 1 | 0.3 | 0.3 | 0.3 |  | 0.3 | 0.3 | 0.3 | 0.3 |
|  | Coupling agent 2 |  |  |  | 0.3 |  |  |  |  |
| (F) | 2,3-Dihydroxy naphthalene | 0.2 | 0.2 | 0.2 | 0.2 | 0.2 | 0.2 |  |  |
|  | 1,2-dihydroxy naphthalene |  |  |  |  |  |  | 0.2 |  |
|  | Catechol |  |  |  |  |  |  |  | 0.2 |
|  | Carnauba wax | 0.2 | 0.2 | 0.2 | 0.2 | 0.2 | 0.2 | 0.2 | 0.2 |
|  | Carbon black | 0.3 | 0.3 | 0.3 | 0.3 | 0.3 | 0.3 | 0.3 | 0.3 |
|  | Spiral flow [cm] | 108 | 107 | 101 | 128 | 188 | 92 | 122 | 123 |
|  | Curing torque ratio [%] | 51 | 51 | 56 | 46 | 33 | 55 | 48 | 48 |
|  | Water absorption [%] | 0.18 | 0.17 | 0.20 | 0.18 | 0.21 | 0.15 | 0.18 | 0.18 |
|  | Flame resistance (UL-94) | V-0 | V-0 | V-0 | V-0 | V-0 | V-0 | V-0 | V-0 |
|  | Gold wire displacement 1 [%] | 2.0 | 2.0 | 2.1 | 1.8 | 1.2 | 2.2 | 1.9 | 1.9 |
|  | Soldering resistance 1 (n/10) | 0 | 0 | 1 | 0 | 0 | 0 | 0 | 0 |

TABLE 15

|  |  | Example (Series V) | | | | Comparative example (Series V) | |
|---|---|---|---|---|---|---|---|
|  |  | 17 | 18 | 19 | 20 | 1 | 2 |
| (A) | Epoxy resin 1 | 3.0 | 3.0 | 3.0 | 3.0 |  |  |
|  | Epoxy resin 2 | 3.0 | 3.0 | 3.0 | 3.0 | 6.2 |  |
|  | Epoxy resin 3 |  |  |  |  |  | 5.9 |
| (B) | Phenol resin 1 | 6.8 | 6.8 | 6.7 | 6.8 | 6.6 | 6.9 |
| (C) | Fused spherical silica | 86.0 | 86.0 | 86.0 | 86.0 | 86.0 | 86.0 |
| (D) | Curing accelerator 1 | 0.2 |  |  |  | 0.2 | 0.2 |
|  | Curing accelerator 2 |  | 0.2 |  |  |  |  |
|  | Curing accelerator 3 |  |  | 0.3 |  |  |  |
|  | Curing accelerator 4 |  |  |  | 0.2 |  |  |
| (E) | Coupling agent 1 | 0.3 | 0.3 | 0.3 | 0.3 | 0.3 | 0.3 |
| (F) | 2,3-Dihydroxy naphthalene |  | 0.2 | 0.2 | 0.2 | 0.2 | 0.2 |
|  | Pyrogallol | 0.2 |  |  |  |  |  |
|  | Carnauba wax | 0.2 | 0.2 | 0.2 | 0.2 | 0.2 | 0.2 |
|  | Carbon black | 0.3 | 0.3 | 0.3 | 0.3 | 0.3 | 0.3 |
|  | Spiral flow [cm] | 122 | 116 | 131 | 121 | 165 | 175 |
|  | Curing torque ratio [%] | 48 | 49 | 46 | 48 | 35 | 33 |
|  | Water absorption [%] | 0.18 | 0.18 | 0.18 | 0.18 | 0.22 | 0.24 |
|  | Flame resistance (UL-94) | V-0 | V-0 | V-0 | V-0 | V-2 | V-2 |
|  | Gold wire displacement 1 [%] | 1.9 | 1.9 | 1.8 | 1.9 | 1.7 | 1.5 |
|  | Soldering resistance 1 (n/10) | 0 | 0 | 0 | 0 | 4 | 7 |

<Evaluation of Encapsulating Material for BGA> (Tables 16 to 17)<

Example V-21

The following components were mixed at ordinary temperatures by a mixer, melted and kneaded by a heating roll at 80 to 100° C., cooled and ground to give an epoxy resin composition. The evaluation results are shown in Table 16.

| | |
|---|---|
| Epoxy resin 1: Epoxy resin of the formula (11) (epoxy equivalent 180; melting point 105° C.; the ratio of the component having a structure of the formula (11) with n equal to 0(zero) was 85% based on the whole of the resin; hydrolyzable chlorine content, 100 ppm) | 1.8 parts by weight |
| Epoxy resin 2: Biphenyl type epoxy resin; epoxy resin of the formula (6) (YX4000HK manufactured by Japan Epoxy Resins Co., Ltd., epoxy equivalent 191, melting point 105° C., represented by the formula (6) wherein R1 are a methyl group in 3, 3', 5, and 5'position, and a hydrogen atom in remaining position) | 4.2 parts by weight |
| Phenol resin 2: A compound represented by the formula (2) or (4) (SN-485 manufactured by Nippon Steel Chemical Co., Ltd., hydroxyl group equivalent 210, softening point 85° C., represented by formula (2) wherein R1 is a phenylene group, R2OH is β-naphthol, R3 is a hydrogen atom, and R4 is a hydrogen atom, or formula (4) wherein R1 is a biphenylene group and R2 is a hydrogen atom) | 6.7 parts by weight |
| Fused spherical silica (average particle diameter 30 μm) | 86.0 parts by weight |
| Curing accelerator 1, triphenyl phosphine | 0.2 part by weight |
| Coupling agent 1, γ-glycidylpropyltrimethoxy silane | 0.3 part by weight |
| 2,3-Dihydroxy naphthalene | 0.2 part by weight |
| Carnauba wax | 0.2 part by weight |
| Carbon black | 0.3 part by weight |

[Evaluation]

The spiral flow, curing torque ratio, water absorption and flame resistance were evaluated in the same manner as in Example Series I. The Flexural modulus upon heating and package warpage were evaluated in the same manner as in Example Series II. Soldering resistance 2 was evaluated in the same manner as for soldering resistance in Example Series II. Gold wire displacement 2 was evaluated in the following manner.

*Gold wire displacement 2: Using a low-pressure transfer molding machine, a package obtained by molding 225 p BGA (substrate thickness 0.36 mm, bismaleimide/triazine/glass cloth substrate: package with a size 24×24 mm and thickness 1.17 mm; silicon chip with a size of 9×9 mm and thickness 0.35 mm; the chip was bonded via gold wires of 25 μm in diameter to a bonding pad of the circuit substrate; the average length of the gold wire, 5 mm) at a mold temperature of 180° C. at a transfer pressure of 7.4 MPa for a curing time of 2 minutes was observed by a soft X-ray fluoroscope, and the displacement of the gold wire 301 was expressed in the ratio of (maximum vertical displacement of the gold wire (X))/(the gold wire length (1))×100, as illustrated in FIG. 3. The unit is %.

Examples V-22 to V-40

Comparative Examples V-4 to V-6>

According to the formulations in Tables 16, 17 and 18, epoxy resin compositions were produced in the same manner as in Example V-21 and evaluated in the same manner as in Example V-21. The evaluation results are shown in Tables 16, 17 and 18.

TABLE 16

| | | Example (Series V) | | | | | | | |
|---|---|---|---|---|---|---|---|---|---|
| | | 21 | 22 | 23 | 24 | 25 | 26 | 27 | 28 |
| (A) | Epoxy resin 1 | 1.8 | 4.1 | 2.9 | 3.0 | 2.9 | 2.8 | 3.0 | 2.9 |
| | Epoxy resin 2 | 4.2 | 1.8 | 2.9 | 3.0 | 2.9 | 2.8 | 3.0 | |
| | Epoxy resin 3 | | | | | | | | 2.9 |
| (B) | Phenol resin 2 | 6.8 | 7.0 | 6.8 | 6.9 | 6.8 | 6.6 | 7.0 | 7.1 |
| (C) | Fused spherical silica | 86.0 | 86.0 | 86.0 | 86.0 | 86.0 | 86.0 | 86.0 | 86.0 |
| (D) | Curing accelerator 1 | 0.2 | 0.2 | 0.2 | 0.2 | 0.2 | 0.2 | 0.2 | 0.2 |
| (E) | Coupling agent 1 | 0.3 | 0.3 | 0.6 | 0.3 | 0.1 | 0.9 | 0.3 | 0.3 |
| (F) | 2,3-Dihydroxy napthalene | 0.2 | 0.2 | 0.05 | 0.2 | 0.5 | 0.2 | 0.02 | 0.2 |
| | Carnauba wax | 0.2 | 0.2 | 0.2 | 0.2 | 0.2 | 0.2 | 0.2 | 0.2 |
| | Carbon black | 0.3 | 0.3 | 0.3 | 0.3 | 0.3 | 0.3 | 0.3 | 0.3 |
| | Spiral flow [cm] | 110 | 90 | 98 | 96 | 93 | 102 | 92 | 108 |
| | Curing torque ratio [%] | 45 | 54 | 48 | 50 | 51 | 48 | 51 | 45 |
| | Water absorption [%] | 0.18 | 0.16 | 0.16 | 0.16 | 0.16 | 0.16 | 0.16 | 0.17 |
| | Flame resistance (UL-94) | V-0 | V-0 | V-0 | V-0 | V-0 | V-0 | V-0 | V-0 |
| | Flexural modulus upon heating [N/mm$^2$] | 600 | 720 | 650 | 650 | 660 | 660 | 690 | 610 |
| | Package warpage [μm] | 48 | 38 | 43 | 42 | 41 | 46 | 42 | 46 |
| | Gold wire displacement 2 [%] | 2.0 | 2.2 | 2.1 | 2.1 | 2.2 | 2.0 | 2.2 | 2.0 |
| | Soldering resistance 2 (n/8) | 1 | 0 | 0 | 0 | 0 | 0 | 0 | 1 |

TABLE 17

|   | | Example (Series V) | | | | | | | |
|---|---|---|---|---|---|---|---|---|---|
|   | | 29 | 30 | 31 | 32 | 33 | 34 | 35 | 36 |
| (A) | Epoxy resin 1 | 3.3 | 2.1 | 3.6 | 3.0 | 3.9 | 2.5 | 3.0 | 3.0 |
|   | Epoxy resin 2 | 3.3 | 2.1 | 3.6 | 3.0 | 3.9 | 2.5 | 3.0 | 3.0 |
|   | Epoxy resin 4 |   | 2.1 |   |   |   |   |   |   |
| (B) | Phenol resin 2 |   | 6.5 | 2.8 | 6.9 | 9.0 | 5.8 | 6.9 | 6.9 |
|   | Phenol resin 3 | 6.1 |   |   |   |   |   |   |   |
|   | Phenol resin 4 |   |   | 2.8 |   |   |   |   |   |
| (C) | Fused spherical silica | 86.0 | 86.0 | 86.0 | 86.0 | 82.0 | 88.0 | 86.0 | 86.0 |
| (D) | Curing accelerator 1 | 0.2 | 0.2 | 0.2 | 0.2 | 0.2 | 0.2 | 0.2 | 0.2 |
| (E) | Coupling agent 1 | 0.3 | 0.3 | 0.3 |   | 0.3 | 0.3 | 0.3 | 0.3 |
|   | Coupling agent 2 |   |   |   | 0.3 |   |   |   |   |
| (F) | 2,3-Dihydroxy napthalene | 0.2 | 0.2 | 0.2 | 0.2 | 0.2 | 0.2 |   |   |
|   | 1,2-dihydroxy napthalene |   |   |   |   |   |   | 0.2 |   |
|   | Catechol |   |   |   |   |   |   |   | 0.2 |
|   | Carnauba wax | 0.2 | 0.2 | 0.2 | 0.2 | 0.2 | 0.2 | 0.2 | 0.2 |
|   | Carbon black | 0.3 | 0.3 | 0.3 | 0.3 | 0.3 | 0.3 | 0.3 | 0.3 |
|   | Spiral flow [cm] | 90 | 92 | 88 | 98 | 156 | 84 | 99 | 98 |
|   | Curing torque ratio [%] | 53 | 51 | 53 | 50 | 42 | 55 | 50 | 50 |
|   | Water absorption [%] | 0.16 | 0.16 | 0.18 | 0.18 | 0.20 | 0.14 | 0.16 | 0.16 |
|   | Flame resistance (UL-94) | V-0 | V-0 | V-0 | V-0 | V-0 | V-0 | V-0 | V-0 |
|   | Flexural modulus upon heating [N/mm$^2$] | 700 | 620 | 740 | 660 | 580 | 800 | 640 | 640 |
|   | Package warpage [μm] | 46 | 47 | 44 | 42 | 55 | 30 | 42 | 43 |
|   | Gold wire displacement 2 [%] | 2.2 | 2.2 | 2.2 | 2.1 | 1.8 | 2.2 | 2.0 | 2.0 |
|   | Soldering resistance 2 (n/8) | 0 | 0 | 1 | 0 | 0 | 0 | 0 | 0 |

TABLE 18

|   | | Example (Series V) | | | | Comparative example (Series V) | |
|---|---|---|---|---|---|---|---|
|   | | 37 | 38 | 39 | 40 | 4 | 5 |
| (A) | Epoxy resin 1 | 3.0 | 3.0 | 2.9 | 3.0 |   |   |
|   | Epoxy resin 2 | 3.0 | 3.0 | 2.9 | 3.0 | 6.1 |   |
|   | Epoxy resin 3 |   |   |   |   |   | 5.8 |
| (B) | Phenol resin 2 | 6.9 | 6.9 | 6.8 | 6.9 | 6.7 | 7.0 |
| (C) | Fused spherical silica | 86.0 | 86.0 | 86.0 | 86.0 | 86.0 | 86.0 |
| (D) | Curing accelerator 1 | 0.2 |   |   |   | 0.2 | 0.2 |
|   | Curing accelerator 2 |   | 0.2 |   |   |   |   |
|   | Curing accelerator 3 |   |   | 0.3 |   |   |   |
|   | Curing accelerator 4 |   |   |   | 0.2 |   |   |
| (E) | Coupling agent 1 | 0.3 | 0.3 | 0.3 | 0.3 | 0.3 | 0.3 |
| (F) | 2,3-Dihydroxy napthalene |   | 0.2 | 0.2 | 0.2 | 0.2 | 0.2 |
|   | Pyrogallol | 0.2 |   |   |   |   |   |
|   | Carnauba wax | 0.2 | 0.2 | 0.2 | 0.2 | 0.2 | 0.2 |
|   | Carbon black | 0.3 | 0.3 | 0.3 | 0.3 | 0.3 | 0.3 |
|   | Spiral flow [cm] | 98 | 91 | 106 | 95 | 140 | 151 |
|   | Curing torque ratio [%] | 50 | 51 | 48 | 50 | 43 | 42 |
|   | Water absorption [%] | 0.16 | 0.16 | 0.16 | 0.16 | 0.17 | 0.19 |
|   | Flame resistance (UL-94) | V-0 | V-0 | V-0 | V-0 | BO | BO |
|   | Flexural modulus upon heating [N/mm$^2$] | 650 | 660 | 660 | 640 | 590 | 550 |
|   | Package warpage [μm] | 42 | 41 | 43 | 41 | 60 | 65 |
|   | Gold wire displacement 2 [%] | 2.0 | 2.1 | 1.9 | 2.1 | 1.8 | 1.8 |
|   | Soldering resistance 2 (n/8) | 0 | 0 | 0 | 0 | 4 | 6 |

INDUSTRIAL APPLICABILITY

According to the present invention, there is obtained a resin composition for semiconductor encapsulation which has excellent soldering resistance, is excellent in flame resistance without using a flame retardant, and has excellent flowability and curing properties. Particularly when the above-mentioned specific compound having two or more phenolic hydroxyl groups in its molecule or the above-mentioned specific crystalline epoxy resin is used, a resin composition having good balance between low warpage and flowability in an area surface-mounted semiconductor package can be obtained. Accordingly, the resin composition according to the present invention is preferable for peripheral surface-mounted semiconductor device packages with lead frame and one side encapsulated area surface-mounted semiconductor device packages.

The invention claimed is:

1. A resin composition for semiconductor encapsulation comprising (A) an epoxy resin containing (a) an epoxy resin represented by formula (1), (B) a compound having two or more phenolic hydroxyl groups in its molecule, (C) an inorganic filler, and (D) a curing accelerator:

(1)

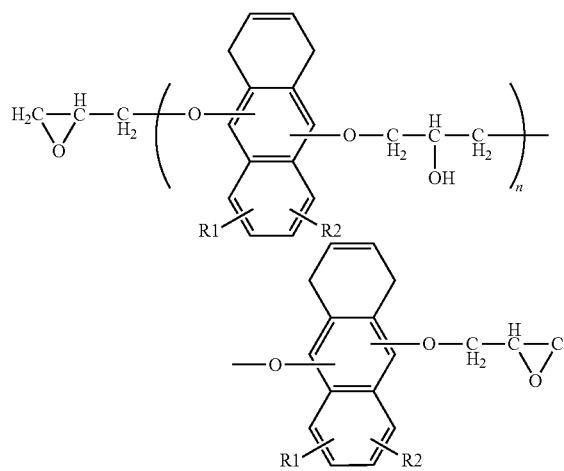

wherein each of R1 and R2 represents a hydrogen atom or a hydrocarbon group with 4 or less carbon atoms and may be the same or different; and 'n' represents a mean value that is a positive number of from 0 to 5; in the formula (1).

2. The resin composition for semiconductor encapsulation according to claim 1, wherein the compound (B) having two or more phenolic hydroxyl groups in its molecule comprises a compound represented by formula (2):

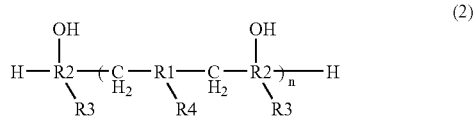
(2)

wherein R1 represents a phenylene group, a biphenylene group, a naphthylene group or a hydroxy phenylene group; R2OH represents a phenol, α-naphthol, or β-naphthol; each of R3 and R4 is a group bonded to each of R2 and R1 and represents a hydrogen atom or a hydrocarbon group with 10or less carbon atoms, and may be the same or different; and 'n' represents a mean value that is a positive number of from 1 to 10; in the formula (2).

3. The resin composition for semiconductor encapsulation according to claim 1, wherein the compound (B) having two or more phenolic hydroxyl groups in its molecule comprises a compound represented by formula (3):

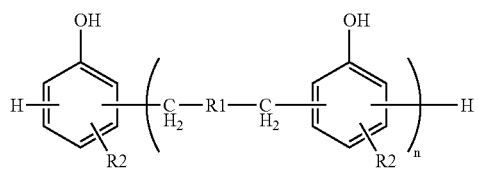
(3)

wherein R1 represents a phenylene group or a biphenylene group; R2 represents a hydrogen atom or a hydrocarbon group with 4 or less carbon atoms and may be the same or different; and 'n' represents a mean value that is a positive number of from 1 to 5; in the formula (3).

4. The resin composition for semiconductor encapsulation according to claim 1, wherein the compound (B) having two or more phenolic hydroxyl groups in its molecule comprises a compound represented by formula (4):

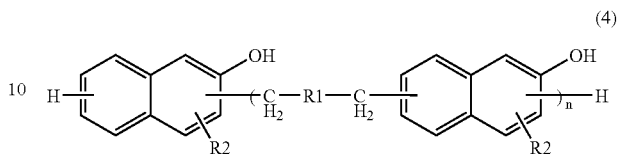
(4)

wherein R1 represents a phenylene group or a biphenylene group; R2 represents a hydrogen atom or a hydrocarbon group with 4 or less carbon atoms and may be the same or different; and 'n' represents a mean value that is a positive number of from 1 to 10; in the formula (4).

5. The resin composition for semiconductor encapsulation according to claim 1, wherein the compound having two or more phenolic hydroxyl groups in its molecule (B) comprises a compound represented by formula (5):

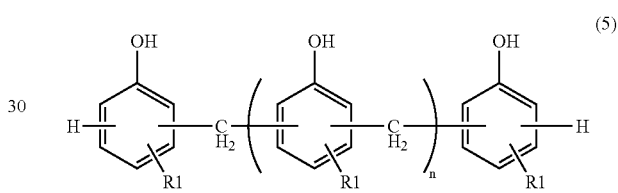
(5)

wherein R1 represents a hydrogen atom or a hydrocarbon group with 4 or less carbon atoms and may be the same or different; and 'n' represents a mean value that is a positive number of from 0 to 8; in the formula (5).

6. The resin composition for semiconductor encapsulation according to claim 5, wherein the compound represented by formula (5) has weight average molecular weight within a range of 400 to 600, polydispersity ratio (($M_w$)/($M_n$)) of weight average molecular weight ($M_w$) to number average molecular weight ($M_n$)within a range of 1.4 or less, and softening point within a range of 60 to 70° C.:

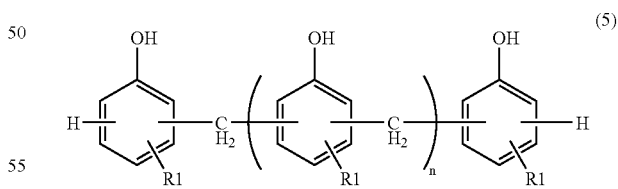
(5)

wherein R1 represents a hydrogen atom or a hydrocarbon group with 4 or less carbon atoms and may be the same or different; and 'n' represents a mean value that is a positive number of from 0 to 8; in the formula (5).

7. The resin composition for semiconductor encapsulation according to claim 1, further comprising (a') a crystalline epoxy resin which is at least one member selected from the group consisting of (a'-1) an epoxy resin represented by formula (6) and (a'-2) an epoxy resin represented by formula (7):

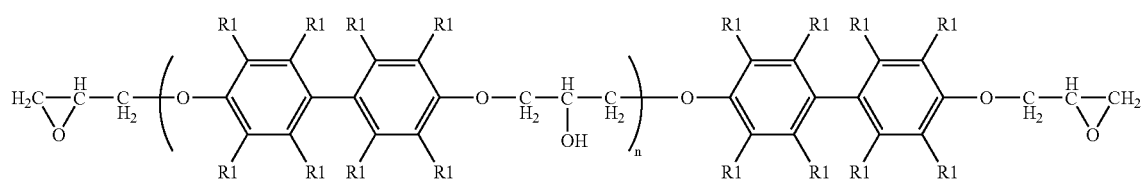

(6)

wherein R1 represents a hydrogen atom or a hydrocarbon group with 4 or less carbon atoms and may be the same or different; and 'n' represents a mean value that is a positive number of from 0 to 5; in the formula (6);

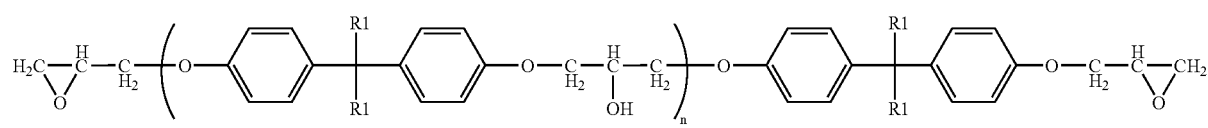

(7)

wherein R1 represents a hydrogen atom or a hydrocarbon group with 4 or less carbon atoms and may be the same or different; and 'n' represents a mean value that is a positive number of from 0 to 5; in the formula (7).

8. The resin composition for semiconductor encapsulation according to claim 1, wherein the curing accelerator (D) is at least one member selected from the group consisting of a compound represented by formula (8), a compound represented by formula (9), and a compound represented by formula (10):

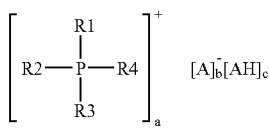

(8)

wherein 'P' represents a phosphorus atom; each of R1, R2, R3 and R4 represents a substituted or unsubstituted aromatic group or a substituted or unsubstituted alkyl group and may be the same or different; 'A' represents an anion of an aromatic organic acid having, on the aromatic ring, at least one functional group selected from the group consisting of a hydroxyl group, a carboxyl group, and a thiol group; 'AH' represents an aromatic organic acid having, on the aromatic ring, at least one group selected from the group consisting of a hydroxyl group, a carboxyl group, and a thiol group;

each of 'a' and 'b' represents an integer of from 1 to 3; 'c' represents an integer of from 0 to 3; and
'a' and 'b' are equal; in the formula (8);

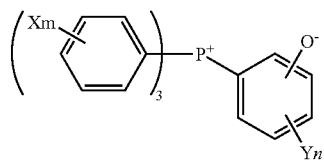

wherein 'X' represents a hydrogen atom or an alkyl group with 1 to 3 carbon atoms; 'Y' represents a hydrogen atom or a hydroxyl group; each of 'm' and 'n' represents an integer of from 1 to 3; in the formula (9);

(10)

wherein 'P' represents a phosphorus atom; each of R1, R2, and R3 represents a substituted or unsubstituted alkyl group with 1 to 12 carbon atoms or a substituted or unsubstituted aryl group with 6 to 12 carbon atoms and may be the same or different; each of R4, R5 and R6 represents a hydrogen atom or a hydrocarbon group with 1 to 12 carbon atoms and may be the same or different;

and R4 and R5 may be combined so as to form a ring structure; in the formula (10).

9. The resin composition for semiconductor encapsulation according to claim 1, further comprising (E) a silane coupling agent and (F) a compound comprising an aromatic ring having two or more hydroxyl groups bound respectively to two or more adjoining carbon atoms constituting the aromatic ring.

10. The resin composition for semiconductor encapsulation according to claim 9, wherein the compound (F) is a compound comprising an aromatic ring having two hydroxyl groups bound respectively to two adjoining carbon atoms constituting the aromatic ring.

11. The resin composition for semiconductor encapsulation according to claim 9, wherein the compound (F) is a compound comprising a naphthalene ring having two or more hydroxyl groups bound respectively to two or more adjoining carbon atoms constituting the naphthalene ring.

12. The resin composition for semiconductor encapsulation according to claim 9, wherein the compound (F) is a compound comprising a naphthalene ring having two hydroxyl groups bound respectively to two adjoining carbon atoms constituting the naphthalene ring.

13. The resin composition for semiconductor encapsulation according to claim 9, wherein the compound (F) is contained in an amount of 0.01% or more by weight to the total amount of the resin composition.

14. The resin composition for semiconductor encapsulation according to claim 9, wherein the silane coupling agent (E) is contained in an amount of 0.01 to 1% by weight to the total amount of the resin composition.

15. The resin composition for semiconductor encapsulation according to claim 1, wherein the inorganic filler (C) is contained in an amount of 80 to 92% by weight to the total amount of the resin composition.

* * * * *